(12) United States Patent
Ito

(10) Patent No.: US 7,529,104 B2
(45) Date of Patent: May 5, 2009

(54) CONDUCTION DEVICE

(75) Inventor: Hideo Ito, Tokorozawa (JP)

(73) Assignee: Pioneer Corporation, Tokyo (JP)

( * ) Notice: Subject to any disclaimer, the term of this patent is extended or adjusted under 35 U.S.C. 154(b) by 869 days.

(21) Appl. No.: 11/049,290

(22) Filed: Feb. 3, 2005

(65) Prior Publication Data

US 2005/0178568 A1 Aug. 18, 2005

(30) Foreign Application Priority Data

Feb. 5, 2004 (JP) .............................. 2004-029600

(51) Int. Cl.
*H05K 7/14* (2006.01)
(52) U.S. Cl. .................................... 361/800
(58) Field of Classification Search ................. 361/799, 361/753, 759, 801, 800; 174/50, 520, 17 R
See application file for complete search history.

(56) References Cited

U.S. PATENT DOCUMENTS 5,280,412 A * 1/1994 Podell et al. ................. 361/710
6,295,210 B1 * 9/2001 Lanzone et al. ............. 361/799
7,179,990 B2 * 2/2007 Kanazawa .................... 174/50

FOREIGN PATENT DOCUMENTS

JP 6-283871 10/1994
JP 10-200283 7/1998

* cited by examiner

*Primary Examiner*—Dean A. Reichard
*Assistant Examiner*—Abiy Getachew
(74) *Attorney, Agent, or Firm*—Kratz, Quintos & Hanson, LLP

(57) ABSTRACT

An upper side plate portion (122) of an upper case comprises an insertion hole (122C) for a setscrew (130) and a resilient deformable portion (124) having a rib (125). When the upper case is attached to a lower case using the setscrew (130), the restoring force of resilient deformation of the resilient deformable portion (124) crimps the rib (125) to a lower side plate (112) of the lower case with a pressure force (W10). Accordingly, only the attachment of both cases with the setscrew (130) crimps the rib (125) of the upper case to the lower side plate (112) of the lower case with the pressure force (W10) and reduces the surface resistance value in a contact portion with the rib (125) in the lower side plate (112) below a predetermined value. Thus, the conduction between the upper case and the lower case can be easily and reliably ensured.

22 Claims, 12 Drawing Sheets

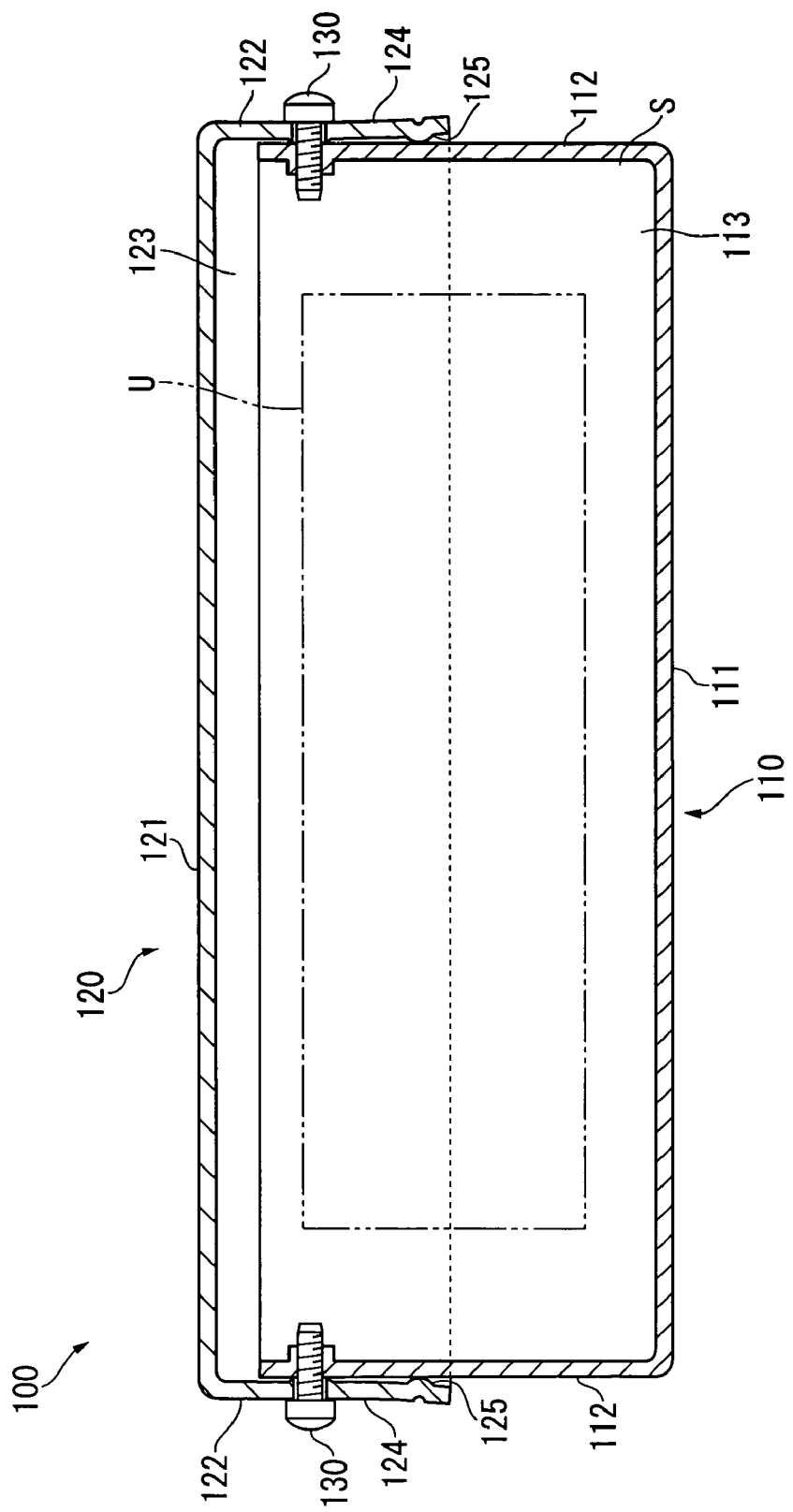

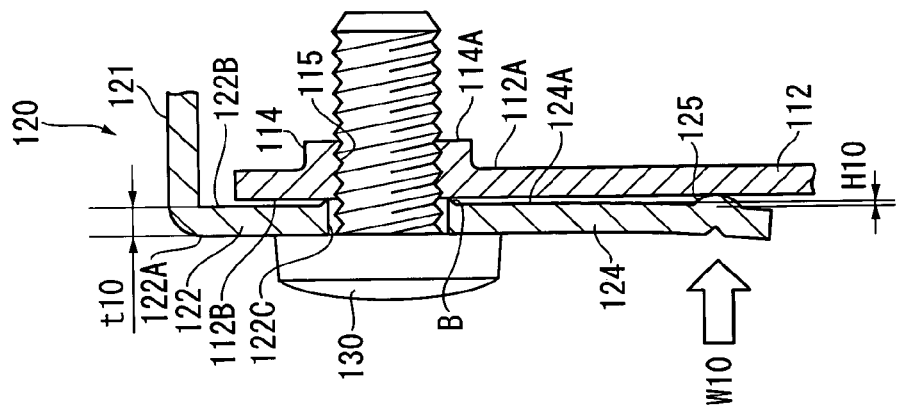
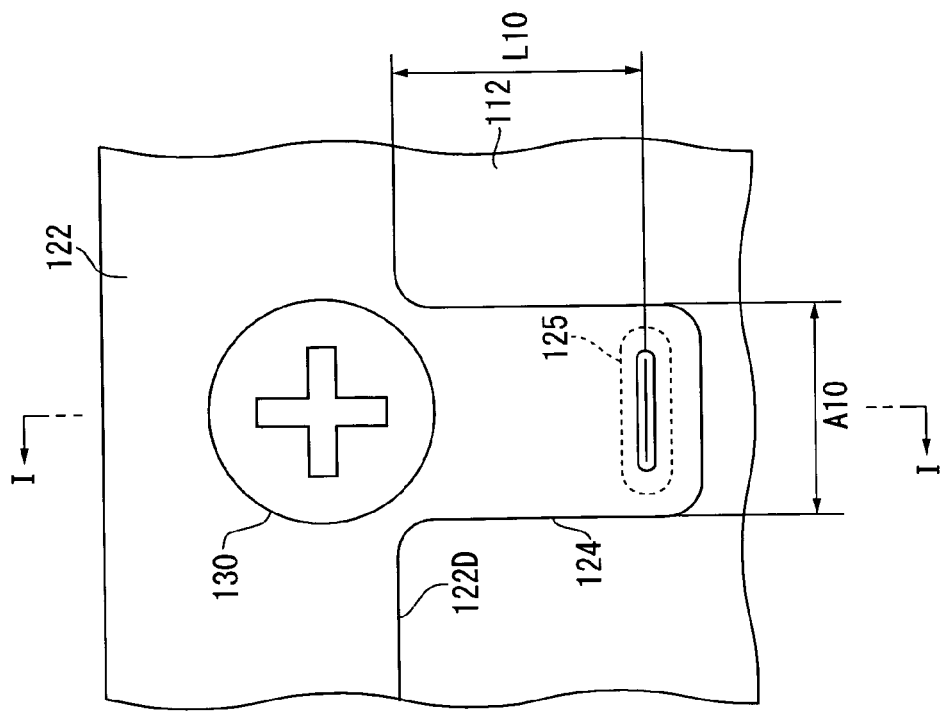

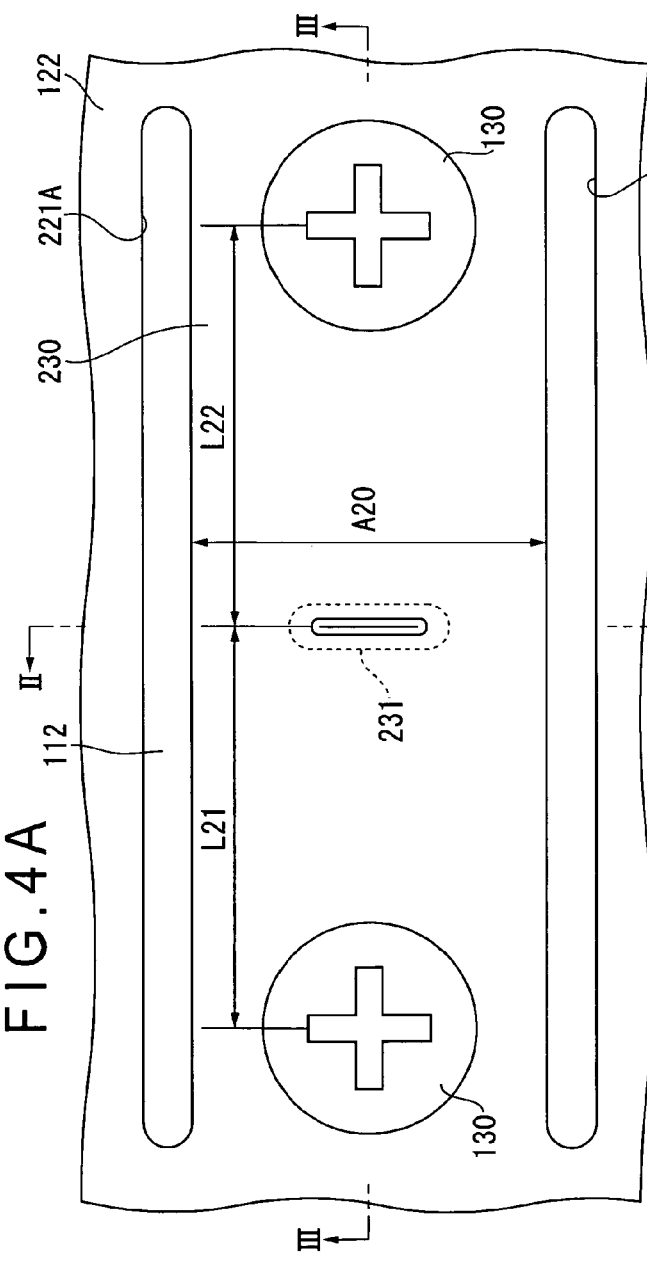
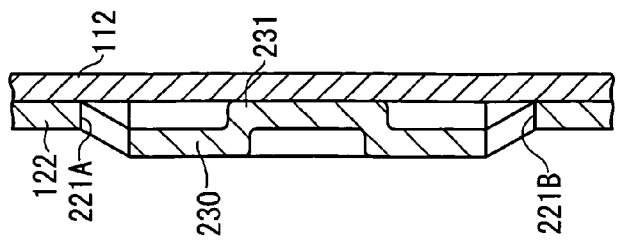
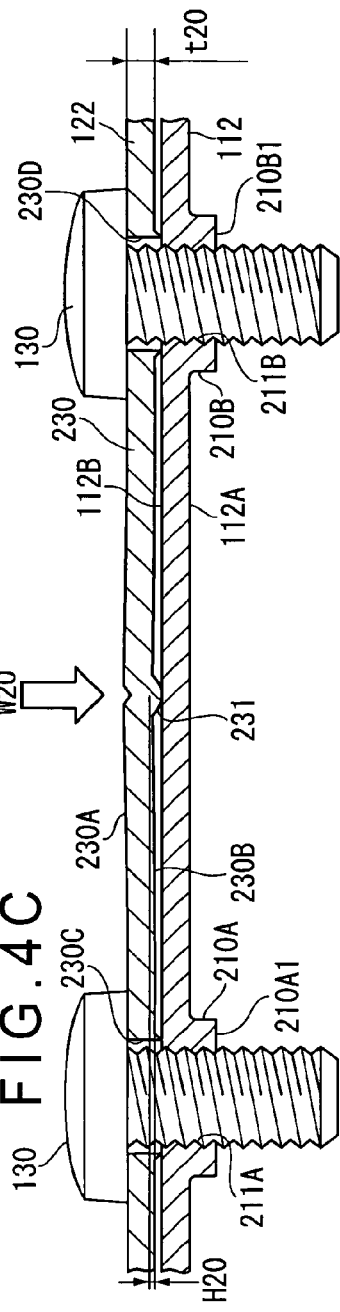

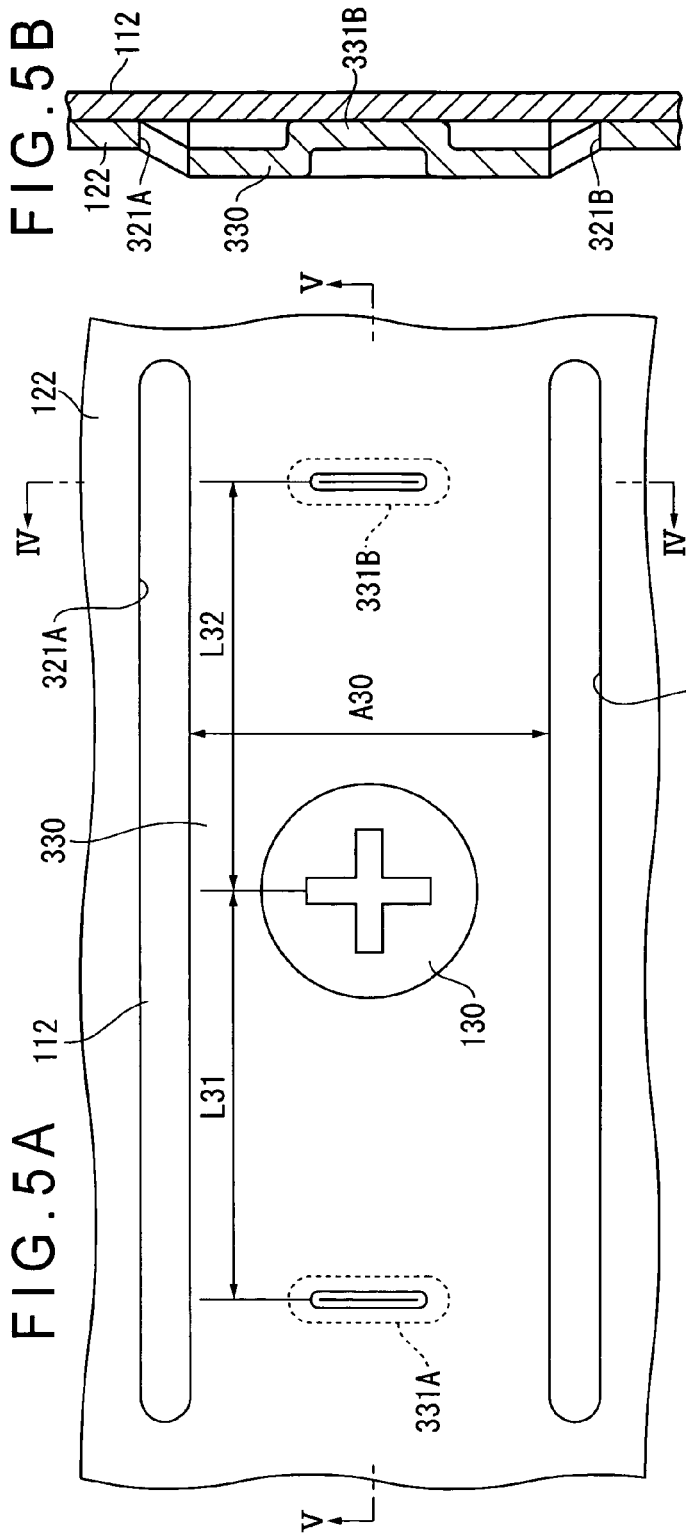
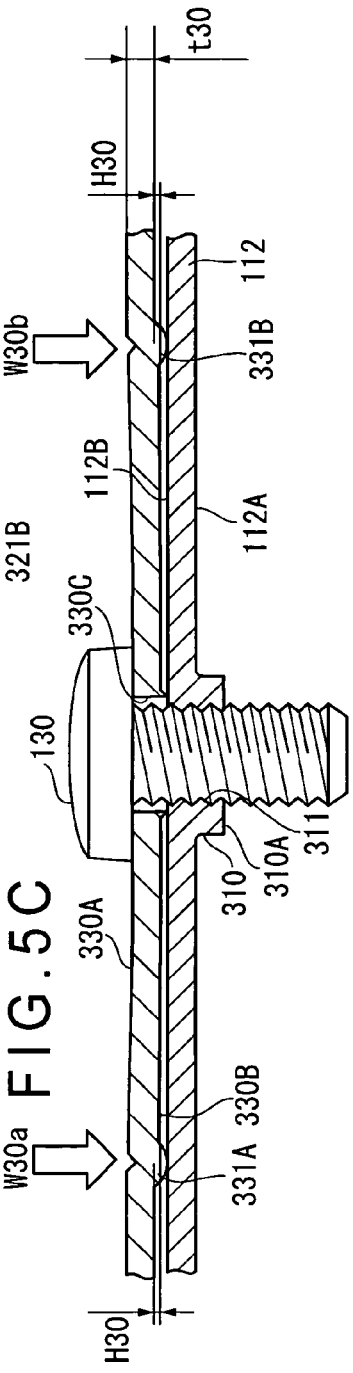
FIG. 5A
FIG. 5B
FIG. 5C

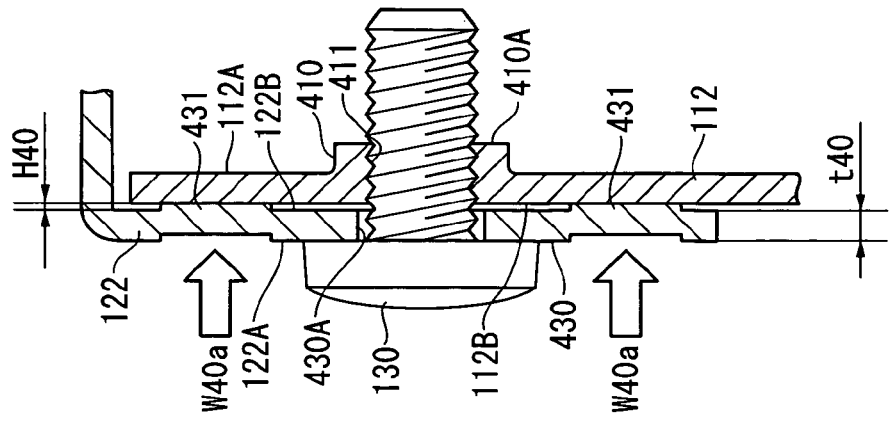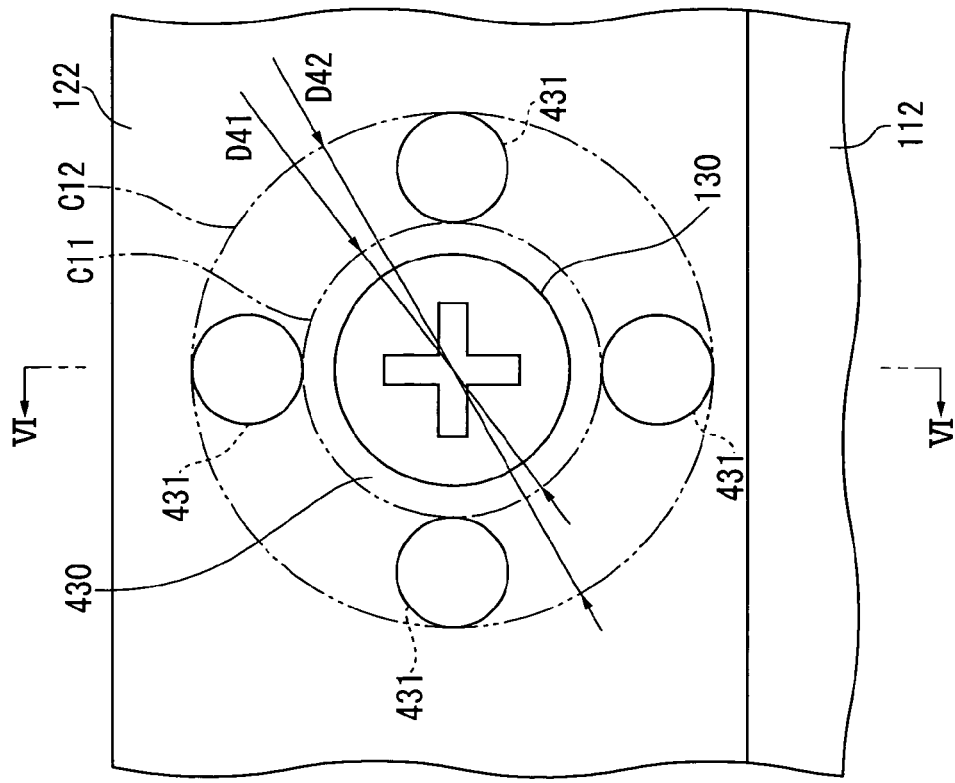

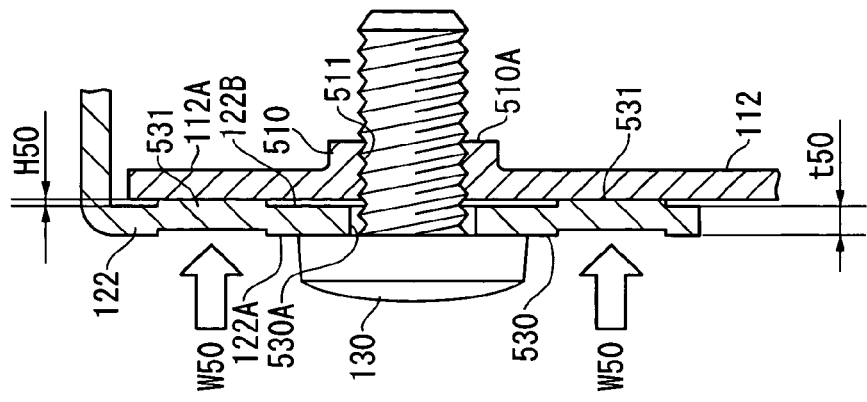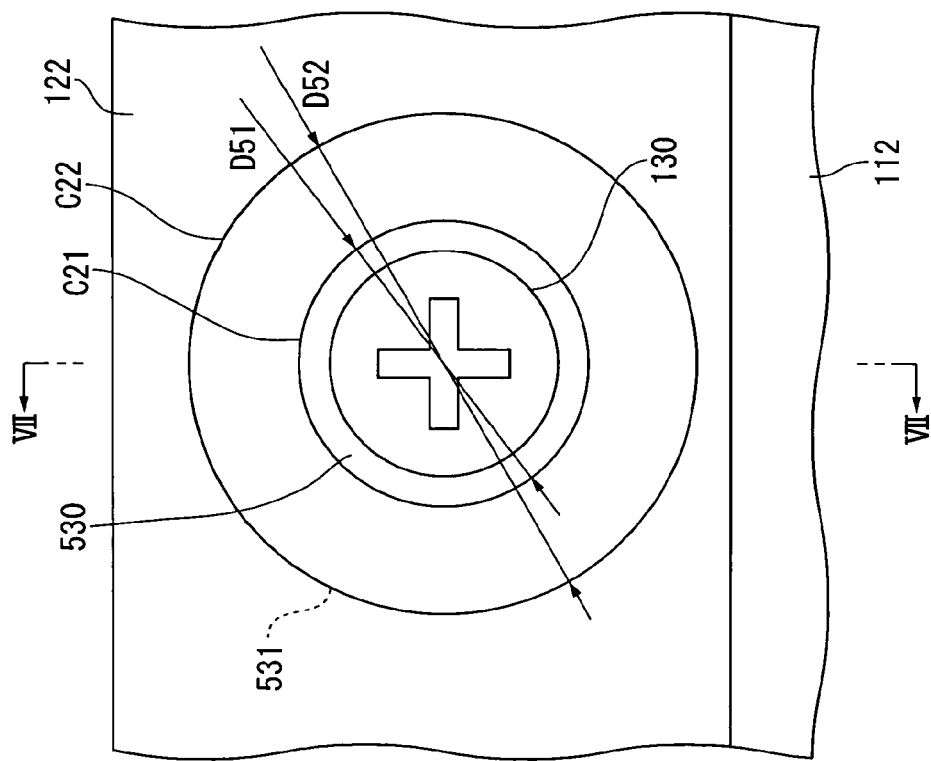

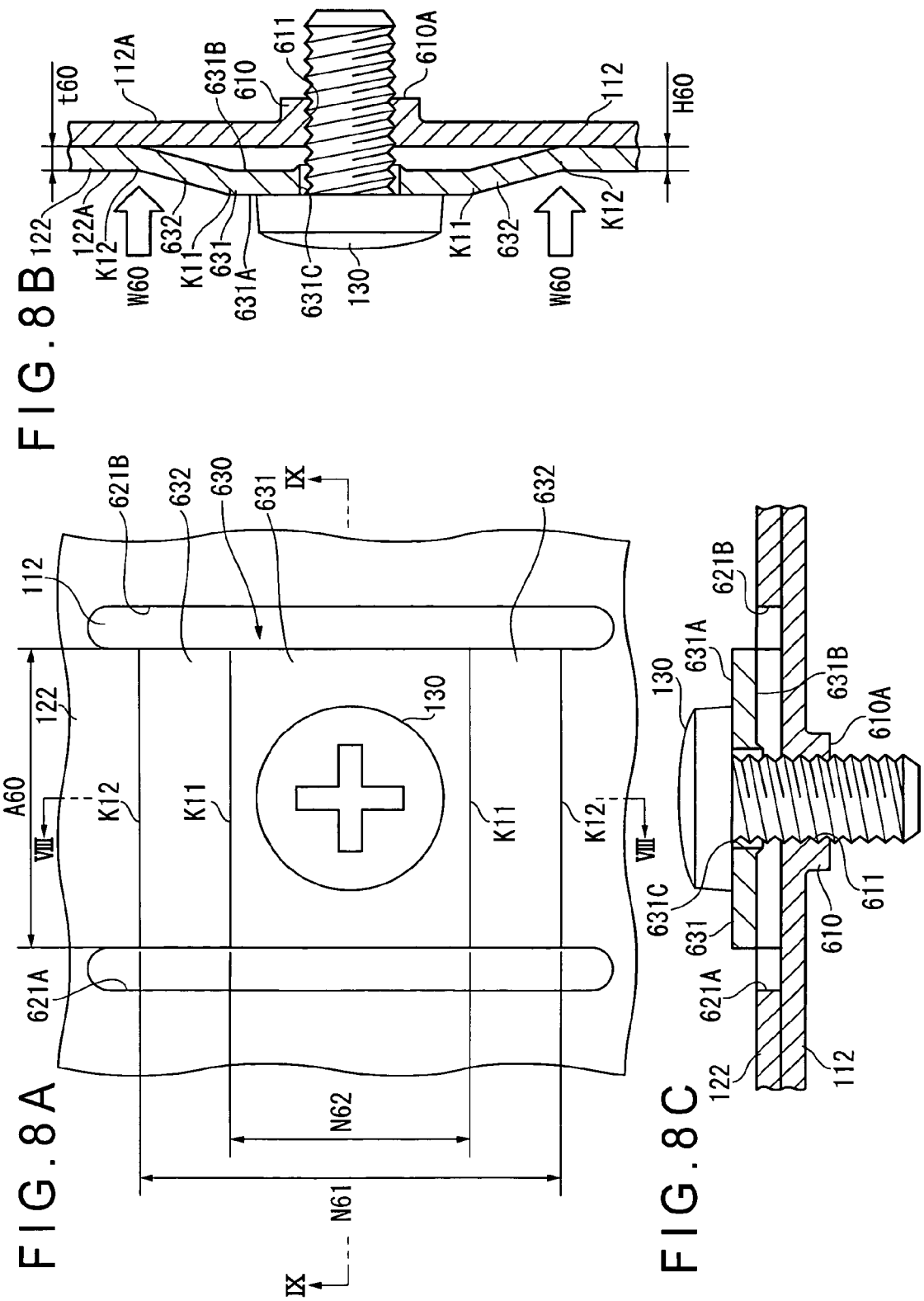

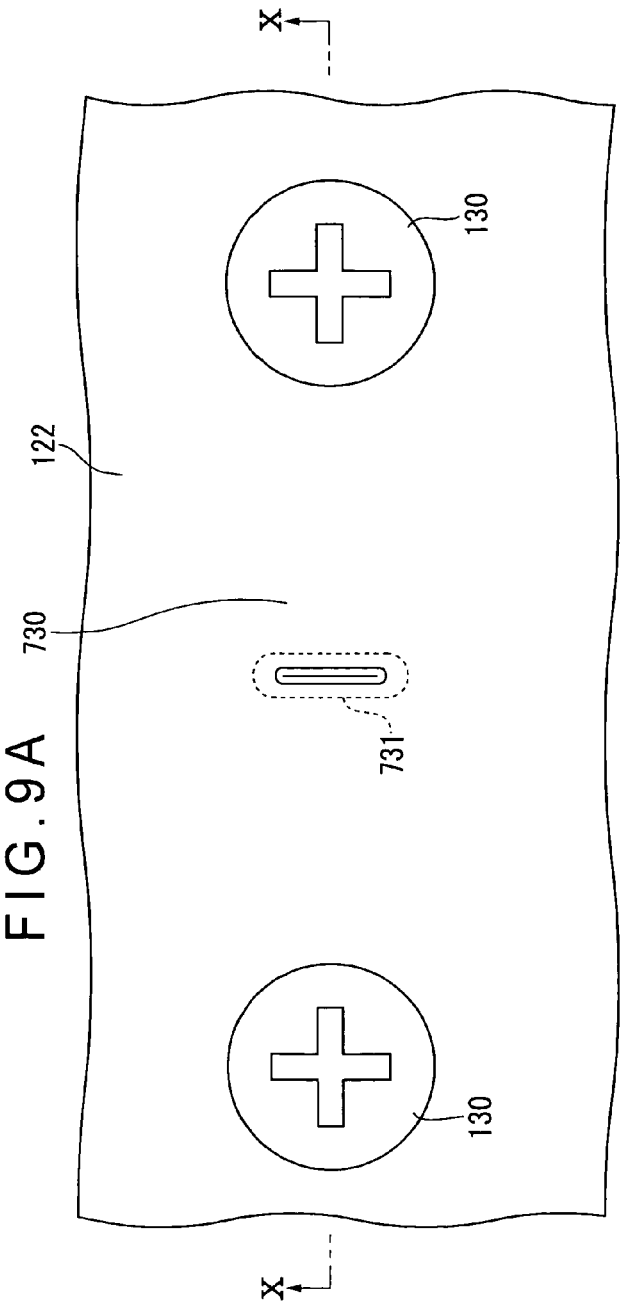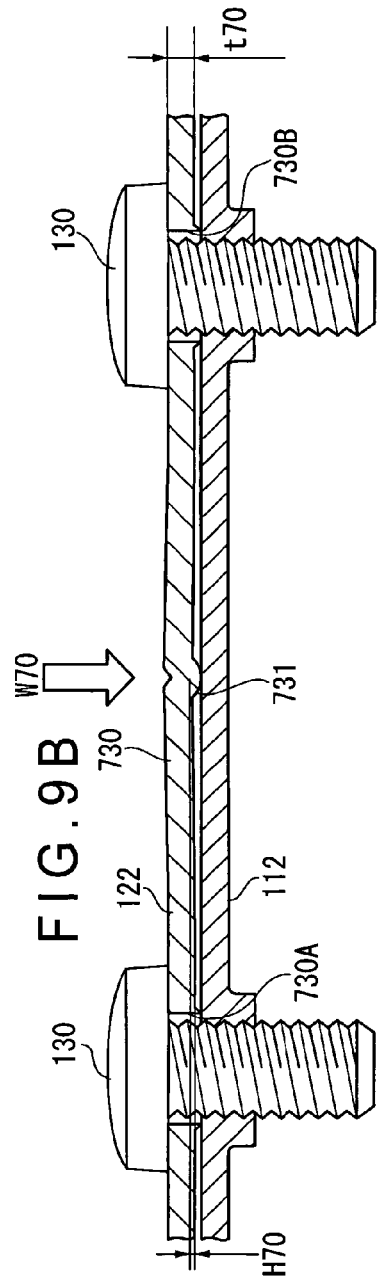

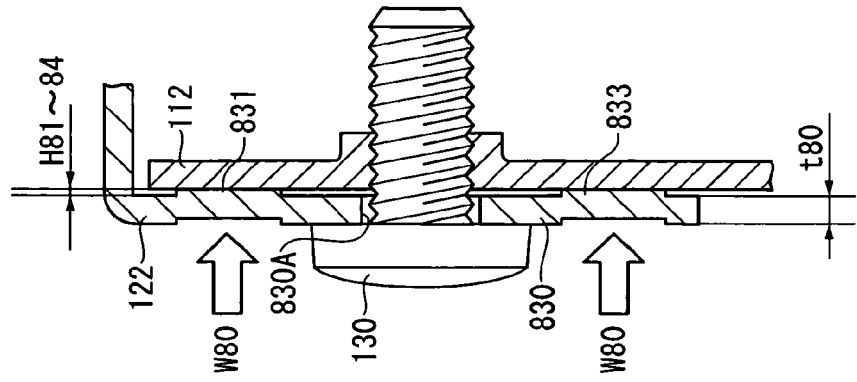
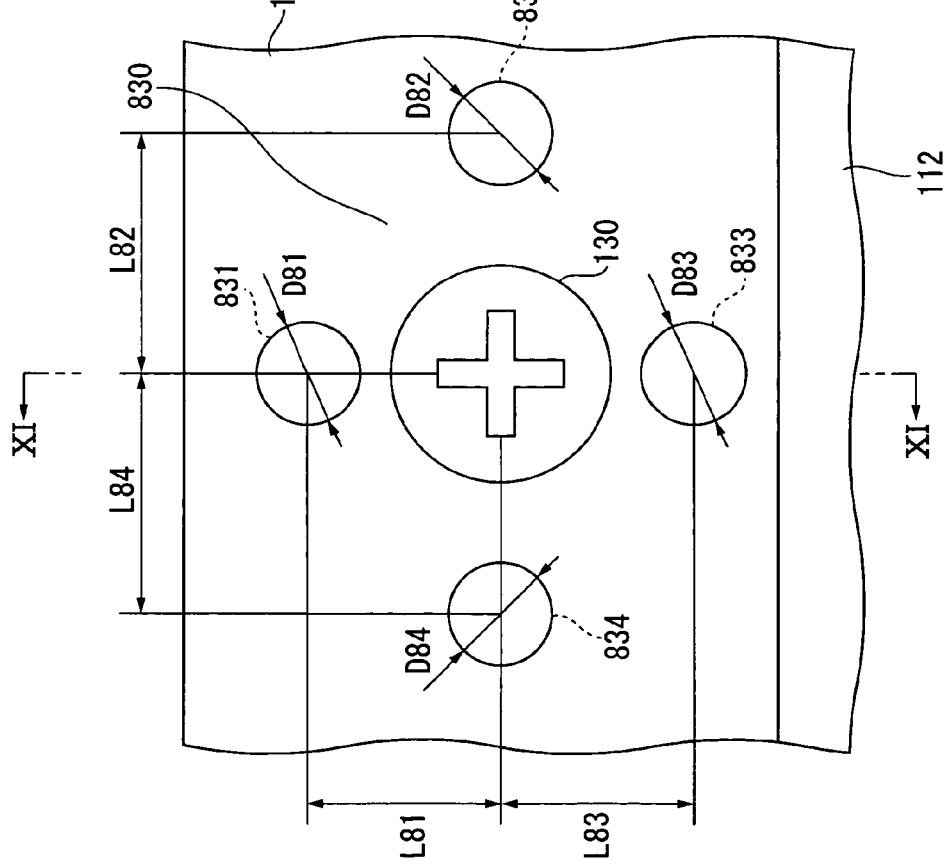
FIG.10A
FIG.10B

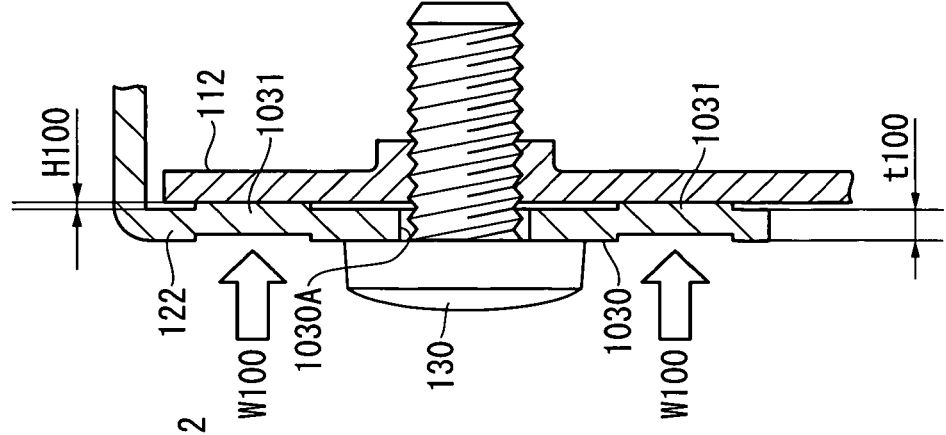
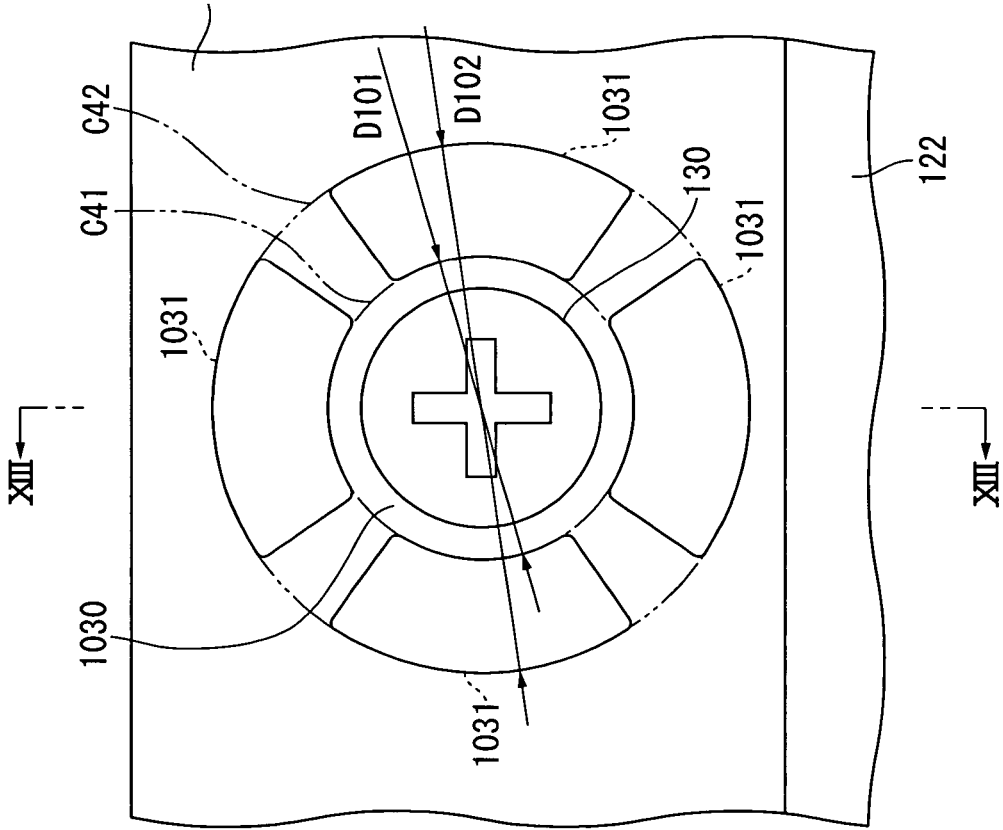

CONDUCTION DEVICE

BACKGROUND OF THE INVENTION

1. Field of the Invention

The present invention relates to a conduction device for ensuring the conduction between a first member and a second member.

2. Description of Related Art

Conventionally, there are known shield cases for receiving electronic devices having electronic circuit boards and electronic circuits or the like (for example, refer to reference 1: Japanese Unexamined Patent Application Publication No. 6-283871, page 3, and reference 2: Japanese Unexamined Patent Application Publication No. 10-200283, page 3).

A shield case according to the reference 1 is formed of a metal material in a substantially box-like shape with the upper face formed with an opening. The side plate portion of the shield case is cut-back toward the inside of the shield case, and a cut-back portion for placing periphery portion of four corners of the electronic circuit board is formed in a substantially rectangular shape. In the central area of the cut-back portion, a screw hole to be screwed with a setscrew is bored. In the peripheral vicinity of the screw hole, a plurality of projections is formed in a radial pattern so as to protrude from the upper face of the cut-back portion. On the other hand, in the periphery of the four corners of the electronic circuit board, an insertion hole to be inserted with a setscrew is bored respectively. In the peripheral vicinity of the insertion hole in the bottom face of the electronic circuit board, earth pattern, which is connected to the grounding of the electronic circuit and has a radial pattern corresponding to the projections of the shield case, is formed.

When an electronic circuit board is attached to the shield case, a mound of the solder is formed by applying solder to the earth pattern of the electronic circuit board, and then, the electronic circuit board is placed on the cut-back portion of the shield case. After that, by screwing a setscrew into the screw hole in the shield case via the insertion hole in the electronic circuit board, the projections of the cut-back portion of the shield case are allowed to cut into the mound of the solder on the electronic circuit board. Thereby, the conduction between the electronic circuit and the shield case is ensured as well as the electronic circuit board is assembled to the shield case.

A shield case according to the reference 2 is formed of a metal material in a substantially box-like shape, and comprises a first case of a substantially box-like shape with one face formed with an opening and a second case of a substantially rectangular shape with another face formed with an opening. In a side plate portion of the first case, an insertion hole to be inserted with a setscrew is bored. In the peripheral vicinity of the insertion hole, a sharp catch, which is cut back so as to protrude toward the inside of the first case, is formed. In a side plate portion of the second case, a screw hole to be screwed with a setscrew is bored.

When receiving an electronic circuit board in the shield case, for example, after placing the electronic circuit board inside the space of the second case, the inner surface of the side plate portion of the first case and the outer surface of the side plate portion of the second case are engaged so as to overlap with each other. After that, by screwing a setscrew into the screw hole in the second case via the insertion hole of the first case, the sharp catch of the first case is allowed to cut into a metal face constituting the second case. Thus, the conduction between the first case and the second case is ensured as well as the first case is fixed to the second case.

However, in the structure according to the reference 1, such a structure that projections of the shield case are allowed to cut into the mound formed on the earth pattern of the electronic circuit board using the setscrew, is adopted. Accordingly, there is a possibility that the cut-in amount of the projections might change depending on the magnitude of the torque of the screwed setscrew or the hardness of the surface of the projections. Therefore, there arises such a problem that the contact resistance between the mound and the projections might change.

Also, in the structure according to the reference 2, same as the structure according to the reference 1, such a structure that the sharp catch on the first case is allowed to cut into the metal surface of the second case using the setscrew, is adopted. Due to the same reason as the structure according to the reference 1, there arises such a problem that the contact resistance between first case and the second case might change.

SUMMARY OF THE INVENTION

An object of the present invention is to provide a conduction device capable of reliably ensuring conduction easily between a first member and a second member.

According to one aspect of the present invention, in a conduction device for ensuring the conduction between a first member and a second member, the conduction device integrally connects and fixes the first member and the second member to each other with a pressure force such that the resistance value between the first member and the second member is a predetermined value or less.

According to another aspect of the present invention, a conduction device for ensuring the conduction between a first member and a second member, includes a fixing member for integrally connecting and fixing the first member and the second member to each other, and a pressure member, which is provided to at least either one the first member and the second member and brought into contact with the other of the first member and the second member so that the resistance value between the first member and the second member is a predetermined value or less owing to the integral connection by the fixing member.

BRIEF DESCRIPTION OF THE DRAWINGS

FIG. 1 is a sectional view schematically showing the structure of a shield case in accordance with a first embodiment of the present invention;

FIG. 2A and FIG. 2B are views respectively showing the schematic structure of an essential portion of the shield case in accordance with the first embodiment, FIG. 2A is a front view, and FIG. 2B is a sectional view taken along the line I-I in FIG. 2A;

FIG. 4A through FIG. 4C are schematic views respectively roughly showing the structure of an essential portion of a shield case in accordance with a second embodiment of the present invention, FIG. 4A is a front view thereof, FIG. 4B is a sectional view taken along the line II-II in FIG. 4A, and FIG. 4C is a sectional view taken along the line III-III in FIG. 4A;

FIG. 5A through FIG. 5C are schematic views respectively roughly showing the structure of an essential portion of a shield case in accordance with a third embodiment of the present invention, FIG. 5A is a front view thereof, FIG. 5B is a sectional view taken along the line IV-IV in FIG. 5A, and FIG. 5C is a sectional view taken along the line V-V in FIG. 5A;

FIG. 6A and FIG. 6B are views respectively roughly showing the structure of an essential portion of a shield case in accordance with a fourth embodiment of the present invention, FIG. 6A is a front view thereof, and FIG. 6B is a sectional view taken along the line VI-VI in FIG. 6A;

FIG. 7A and FIG. 7B are views respectively roughly showing the structure of an essential portion of a shield case in accordance with a fifth embodiment of the present invention, FIG. 7A is a front view thereof, and FIG. 7B is a sectional view taken along the line VII-VII in FIG. 7A;

FIG. 8A through FIG. 8C are schematic views respectively roughly showing the structure of an essential portion of a shield case in accordance with another embodiment of the present invention, FIG. 8A is a front view thereof, FIG. 8B is a sectional view taken along the line VIII-VIII in FIG. 8A, and FIG. 8C is a sectional view taken along the line IX-IX in FIG. 8A;

FIG. 9A and FIG. 9B are views respectively roughly showing the structure of an essential portion of a shield case in accordance with further another embodiment of the present invention, FIG. 9A is a front view thereof, and FIG. 9B is a sectional view taken along the line X-X in FIG. 9A;

FIG. 10A and FIG. 10B are views respectively roughly showing the structure of an essential portion of a shield case in accordance with furthermore another embodiment of the present invention, FIG. 10A is a front view thereof, and FIG. 10B is a sectional view taken along the line XI-XI in FIG. 10A;

FIG. 11A is a front view thereof, and FIG. 11B is a sectional view taken along the line XII-XII in FIG. 11A;

FIG. 12A and FIG. 12B are views respectively roughly showing the structure of an essential portion of a shield case in accordance with further another embodiment of the present invention, FIG. 12A is a front view thereof, and FIG. 12B is a sectional view taken along the line XIII-XIII in FIG. 12A.

DETAILED DESCRIPTION OF PREFERRED EMBODIMENTS

First Embodiment

Figure 3:
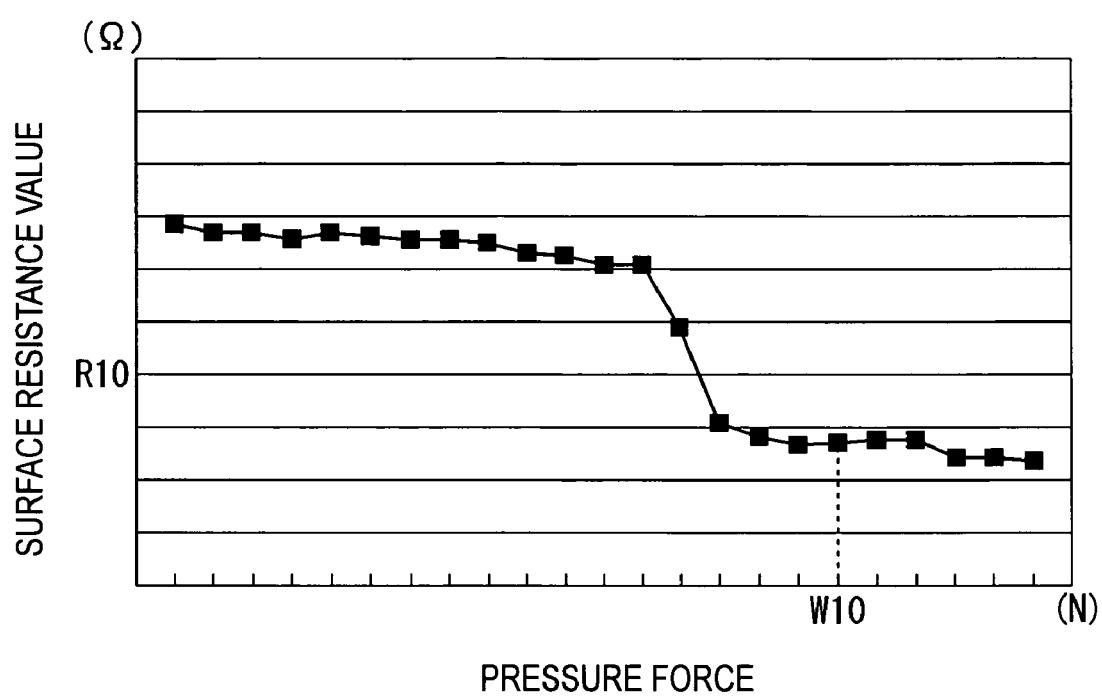
FIG. 3 is a graph showing a relationship between pressure force and surface resistance value on the surface of a lower side plate in the first embodiment.

A first embodiment of the present invention will be described below with reference to the drawings. In this embodiment, the description will be made while giving an example of a shield case in which an electronic device having an electronic circuit is received and a conduction device of the present invention is applied thereto. But the present invention is not limited to the above. FIG. 1 is a sectional view schematically showing the structure of a shield case. FIG. 2A and FIG. 2B are views respectively showing the schematic structure of an essential portion of the shield case in accordance with the first embodiment. FIG. 2A is a front view, and FIG. 2B is a sectional view taken along the line I-I in FIG. 2A.

[Structure of the Shield Case]

In FIG. 1, reference numeral 100 denotes a shield case. The shield case 100 receives an electronic device U having an electronic circuit (not shown). The shield case 100 is formed in a substantially thin box-like shape, which is not shown in the figures. The shield case 100 comprises a lower case 110, which is a first case as a first member having a substantially thin box-like shape with the upper face opened, and an upper case 120, which is a second case as a second member having a substantially thin box-like shape with the bottom face opened, and which closes the upper face of the lower case 110.

The upper case 120 is formed of a material such as a metal having conductivity, which is capable of press molding. Also, on the surface of the upper case 120, for the purpose of heat liberation, vibration isolation, anti-rust or the like, an insulating layer (not shown) is formed by means of plating or coating. The upper case 120 comprises a top plate portion 121 having a substantially rectangular plain plate, an upper side plate portion 122 formed being bent substantially perpendicular to both side edges in the longitudinal direction of the top plate portion 121 and an upper end plate portion 123 formed being bent substantially perpendicular to both end edges in the longitudinal direction of the top plate portion 121 in the same direction of the upper side plate portion 122 with the bottom face opened. In the description of this embodiment and the following embodiments, the direction, which crosses the vertical direction in the upper side plate portion 122 substantially perpendicular thereto, will be appropriately referred to as right-left direction.

As shown in FIG. 2A and FIG. 2B, bored in the lower end side of the upper side plate portion 122 is an insertion hole 122C which communicates an outer surface 122A and an inner surface 122B with each other and is inserted with a setscrew 130. Integrally formed in the upper side plate portion 122 is a resilient deformable portion 124 constituting a pressure member, which is extended downward so as to protrude in a tongue-like shape from a lower end edge 122D as the end edge. The resilient deformable portion 124 is formed in a substantially rectangular plate shape so that the longitudinal direction thereof substantially agrees with the vertical direction. Also, the resilient deformable portion 124 is formed deformable resiliently in the direction substantially perpendicular to the inner surface 124A. And formed in the lower end side of the resilient deformable portion 124 is a rib 125 constituting a pressure member, which is formed by means of press molding so as to swell out from the inner surface 124A. Here, an example of a structure in which the rib 125 is formed on the resilient deformable portion 124 by means of press molding. However, the structure is not limited to the above. For example, a separately formed rib 125 may be attached to the resilient deformable portion 124 with, for example, an adhesive. Also, an example of the structure in which only one rib 125 is formed is given. However, the structure is not limited to the above. Such a structure that a plurality of ribs 125 is formed may be adopted. The rib 125 is formed in a substantially rectangular shape viewed from the front so that the longitudinal direction thereof substantially agrees with the right-left direction, and the section substantially perpendicular to the longitudinal direction is a substantially semi-circular shape. Here, an example of the structure in which the rib 125 is formed in the above-described configuration is given. However, the structure is not limited to the above, but another appropriate configuration may be adopted.

The conduction device of the present invention comprises the resilient deformable portion 124, the rib 125 and the setscrew 130.

The resilient deformable portion 124 and the rib 125 are designed based on the following formula 1 and formula 2.

$$I10=((A10) \times (t10)^3)/12 \qquad (1)$$

$I10$: section secondary moment of the resilient deformable portion 124

$A10$: dimension of length in the right-left direction of the resilient deformable portion 124 t10: dimension of thickness of the resilient deformable portion 124

$$W10 = (3 \times (E10) \times (I10) \times (H10))/(L10)^3 \qquad (2)$$

W10: pressure force in the direction to be closer to a lower side plate 112 of the rib 125

E10: longitudinal resilient coefficient of material constituting the resilient deformable portion 124

H10: deformation amount of the rib 125

L10: dimension of length from the base end of the resilient deformable portion 124 to the rib 125

That is to say, the resilient deformable portion 124 is formed so that the dimension of thickness is t10; the dimension of length in the right-left direction; i.e., the dimension of length of shorter side is A10 and the longitudinal resilient coefficient is E10. Also, the rib 125 is formed so that the deformation amount thereof is H10, the dimension of length up to the base end of the resilient deformable portion 124; i.e., the lower end edge 122D of the upper side plate portion 122 is L10.

On the other hand, the lower case 110 is formed of a material such as, for example, a metal having the conductivity. On the surface of the lower case 110, same as the upper case 120, an insulating layer is formed by means of plating or coating for the purpose of heat liberation, vibration isolation or anti-rust. Also, the lower case 110 has a grounded grounding portion (not shown). The lower case 110 comprises a bottom plate portion 111 having a shape of a substantially rectangular plain plate, which is substantially the same configuration as that of the top plate portion 121, a lower side plate 112 formed being bent substantially perpendicular to the both side edges in the longitudinal direction of the bottom plate portion 111 and a lower end plate portion 113 formed being bent substantially perpendicular to the same direction as that of the lower side plate 112 at one end edge in the longitudinal direction of the bottom plate portion 111 with the upper face opened.

Integrally formed in the upper end side of the lower side plate 112 is a projection 114 protruded in a shape of a substantially short cylinder toward the inside of the lower case 110 from an inner surface 112A. The projection 114 is formed in a position substantially corresponding to the insertion hole 122C of the resilient deformable portion 124 when the upper case 120 is attached to the lower case 110. In a position, which is at substantially the center of the projection 114 in the diameter direction and corresponding to the insertion hole 122C of the upper case 120, a screw hole 115, which communicates an inner surface 114A of the projection 114 with the outer surface 112B of the lower side plate 112 and is screwed with the setscrew 130, is bored.

[Assembling of the Upper Case to the Lower Case]

Next, assembling of the upper case 120 to the lower case 110 will be described with reference to figures.

First of all, the upper case 120 is brought to a position where the insertion hole 122C and the screw hole 115 of the lower case 110 agree with each other. Then, the setscrew 130 is screwed into the screw hole 115 via the insertion hole 122C. Thereby, the upper case 120 is attached to the lower case 110 and an electronic device receiving space S is partitioned and formed. When the setscrew 130 is screwed in, the base end side of the resilient deformable portion 124 is forced in the direction to be closer to the lower side plate 112 and shifts toward it. On the other hand, the front-end side of the resilient deformable portion 124 is restrained from moving in the direction to be closer to the lower side plate 112 by the rib 125. Owing to this, the resilient deformable portion 124 is resiliently deformed so that the front-end side thereof is away therefrom by a distance substantially equal to the deformation amount H10 in the rib 125. And the rib 125 is pressed against the lower side plate 112 with a pressure force W10 expressed by the above-described formula 1 around the top area thereof owing to the restoring force when the resilient deformable portion 124 is resiliently deformed.

Here, in the lower side plate 112, the relationship between the pressure force and the surface resistance value is expressed by, for example, a graph in FIG. 3. Thus, when the rib 125 is pressed with a predetermined pressure force W10, between the upper case 120 and the lower case 110, a predetermined surface resistance value, for example, R10 or less is achieved. Accordingly, by designing the resilient deformable portion 124 and the rib 125 so that the rib 125 is pressed with the pressure force W10, the conduction can be ensured.

[Advantages of the First Embodiment]

As described above, in the first embodiment, the upper side plate portion 122 of the upper case 120 of the shield case 100 is formed with the insertion hole 122C to be inserted with the setscrew 130 and the resilient deformable portion 124 having the rib 125. Owing to this arrangement, when the upper case 120 is attached to the lower case 110 by screwing the setscrew 130 into the screw hole 115 formed in the lower case 110 via the insertion hole 122C, owing to the restoring force due to the resilient deformation of the resilient deformable portion 124, the rib 125 is pressed against the lower side plate 112 of the lower case 110 with the pressure force W10. Accordingly, by simply attaching the upper case 120 to the lower case 110 with the setscrews 130, the rib 125 on the upper case 120 can be pressed against the lower side plate 112 of the lower case 110 with the pressure force W10, and the surface resistance value in the contact area with the rib 125 in the lower side plate 112 can be reduced to R10 or less. Accordingly, the conduction between the upper case 120 and the lower case 110 can be readily and reliably ensured. Also, since the rib 125 is pressed against the lower case 110 with the pressure force W10 using the restoring force due to the resilient deformation of the resilient deformable portion 124, the pressure force W10 can be maintained to a specific level without depending on the torque of the setscrew 130. Accordingly, the conduction between the upper case 120 and the lower case 110 can be reliably ensured.

In addition to a conventional structure, since only the resilient deformable portion 124 and the rib 125 are formed on the upper side plate portion 122, the cost of the shield case 100 can be prevented from increasing and kept to a minimum.

Further, as shown in FIG. 2A and FIG. 2B, for example, by being interposed by a burr B formed at the inner surface 122B side of the insertion hole 122C, even when the vicinity of the insertion hole 122C of the upper side plate portion 122 failed in coming into contact with the lower side plate 112 when the setscrew 130 is screwed in, by bringing the rib 125 into contact with the lower side plate 112 by pressure, the conduction between the upper case 120 and the lower case 110 can be ensured. Therefore, it is not necessary to take a measure to prevent the burr B from being formed while the upper case 120 is manufactured. Accordingly, the manufacturing process of the upper case 120 can be simplified.

Furthermore, due to environmental changes, even when the vicinity of the insertion hole 122C warps in the direction away from the lower side plate 112 caused by the deformation of the upper side plate portion 122, by bringing the rib 125 into contact with the lower side plate 112, the conduction between the upper case 120 and the lower case 110 can be ensured. Therefore, it is not necessary to limit, for example, the application conditions. Accordingly, the versatility of the shield case 100 is increased.

The rib 125 is formed so as to swell out from the inner surface 124A of the resilient deformable portion 124 into a substantially semi-circular shape in section. Owing to this, since the vicinity of the tip of the rib 125 is brought into contact with the lower side plate 112 with pressure, the contact area between the rib 125 and the lower side plate 112 can be reduced to a minimum. Accordingly, since the pressure force W10 per unit area applied to the lower side plate 112 can be made larger, the conduction between the upper case 120 and the lower case 110 can be reliably ensured.

A structure, in which the resilient deformable portion 124 having the rib 125 is formed so as to deform resiliently in the direction substantially perpendicular to the inner surface 124A, and by the restoring force of the resilient deformation of the resilient deformable portion 124, the rib 125 is brought into contact with the lower side plate 112, is adopted. Owing to this, it is not necessary to provide any dedicated member for bringing the rib 125 into contact with the lower side plate 112. Accordingly, it is possible to reduce the number of parts; and thus, the cost of the shield case 100 can be reduced and the manufacturing performance thereof can be increased.

The resilient deformable portion 124 and the rib 125 are arranged so that the pressure force W10 to press them against the lower side plate 112 can be calculated using the above-described formula 1 and formula 2. Owing to this, by appropriately changing each of the parameters in the formula 1 and formula 2, the rib 125 can be brought into contact with the lower side plate 112 with a preferred pressure force W10. Accordingly, even when various insulating layers are formed on the surface of the lower case 110, the conduction between the upper case and the lower case can be reliably ensured.

Further, the conduction device comprising the resilient deformable portion 124, the rib 125 and the setscrew 130 is applied to the upper case 120 and lower case 110 for receiving the electronic device U. Owing to this, as described above, only by attaching the upper case 120 to the lower case 110 with the setscrew 130, the conduction between the upper case 120 and the lower case 110 can be reliably ensured; and accordingly, the shield case 100 capable of ensuring the conduction with a simple structure can be provided.

Furthermore, since the grounding portion is provided grounded to the lower case 110, only by attaching the upper case 120 to the lower case 110 with the setscrew 130, the grounding of the upper case 120 can be ensured. Owing to this, the shield case 100 capable of ensuring the grounding of the upper case 120 can be provided.

The rib 125 is formed in the lower end side of the resilient deformable portion 124 by means of press molding. Owing to this, the process for forming the rib 125 is simplified.

Second Embodiment

Next, a second embodiment of the present invention will be described below with reference to the drawings. In this embodiment, the description will be made while giving an example of the same shield case as that in the first embodiment, but the present invention is not limited thereto. The shield case in this embodiment and the following embodiments has a different structure in the side plate portion of the upper case and the side plate portion of the lower case from those in the shield case of the first embodiment. The structure of the other portions is the same as that of the shield case in the first embodiment. Therefore, the side plate portion of the upper case and the side plate portion of the lower case will be described in detail. FIG. 4A through FIG. 4C are schematic views respectively roughly showing the structure of an essential portion of the shield case in accordance with the second embodiment of the present invention. FIG. 4A is a front view thereof, FIG. 4B is a sectional view taken along the line II-II in FIG. 4A, and FIG. 4C is a sectional view taken along the line III-III in FIG. 4A.

[Structure of the Shield Case]

In FIG. 4A through FIG. 4C, reference numerals 112 and 122 denote the lower side plate of the lower case 110 and the upper side plate portion of the upper case 120 constituting the shield case 100 as shown in FIG. 1. Here, the vertical direction in FIG. 4A substantially agrees with the vertical direction of the upper case 120.

In the upper side plate portion 122, slits 221A and 221B having a substantially thin elongated rectangular shape respectively, of which longitudinal direction substantially agrees with the right-left direction, are formed in parallel with each other in the vertical direction. A portion having a substantially rectangular plate shape formed between the slits 221A and 221B, of which longitudinal direction substantially agrees with the right-left direction, is a resilient deformable portion 230 constituting the pressure member, which is deformable resiliently in the direction toward/away from the lower side plate 112. In the left end side of the resilient deformable portion 230, an insertion hole 230C, which communicates an outer surface 230A and an inner surface 230B of the resilient deformable portion 230 with each other and is inserted with the setscrew 130, is bored; and in the right end side thereof, an insertion hole 230D having substantially the same configuration as the insertion hole 230C is bored. Also, in substantially the center of the resilient deformable portion 230 in the right-left direction of the inner surface 230B, a rib 231 constituting the pressure member, which is formed by means of press molding so as to swell out from the inner surface 230B, is provided. The rib 231 is formed in a substantially thin elongated rectangular shape viewed from the front, of which longitudinal direction substantially agrees with the vertical direction, and the section thereof substantially perpendicular to the longitudinal direction has a substantially semi-circular shape. The conduction device of the present invention comprises the resilient deformable portion 230, the rib 231 and the setscrews 130.

The resilient deformable portion 230 and the rib 231 are designed based on the following formula 3 and formula 4.

$$I20=((A20)\times(t20)^3)/12 \qquad (3)$$

I20: sectional secondary moment of the resilient deformable portion 230

A20: dimension of length in the vertical direction of the resilient deformable portion 230 t20: dimension of thickness of the resilient deformable portion 230

$$W20=(3\times(E20)\times(I20)\times(H20)\times(L21+L22)^3)/((L21)^3\times(L22)^3) \qquad (4)$$

W20: pressure force of the rib 231 in the direction to be closer to the lower side plate 112

E20: the longitudinal resilient coefficient of the material constituting the resilient deformable portion 230

H20: deformation amount of the rib 231

L21: dimension of length from the insertion hole 230C to the rib 231

L22: dimension of length from the insertion hole 230D to the rib 231

That is to say, the resilient deformable portion 230 is formed so that the dimension of thickness is t20; the dimension of length in the vertical direction; i.e., the dimension of length of shorter side is A20 and the longitudinal resilient coefficient is E20. Also, the rib 231 is formed so that the deformation amount thereof is H20, the dimension of length up to the insertion holes 230C, 230D is L21 and L22 respectively.

On the other hand, integrally formed in the lower side plate 112 are projections 210A and 210B, which are protruded in a substantially short cylinder shape from the inner surface 112A toward the inside of the lower case 110. These projections 210A and 210B are formed at positions where, when the upper case 120 is attached to the lower case 110, the projections 210A and 210B substantially correspond to the insertion holes 230C and 230D of the upper case 120 respectively. And, bored at substantially the center in the diameter direction of the projections 210A and 210B and at the positions corresponding to the insertion holes 230C and 230D of the upper case 120 are screw holes 211A and 211B respectively, which communicate between inner surfaces 210A1 and 210B1 of the projections 210A and 210B and the outer surface 112B of the lower side plate 112 with each other and are screwed with the setscrews 130.

[Assembling of the Upper Case to the Lower Case]

Next, assembling of the upper case 120 to the lower case 110 will be described with reference to figures.

First of all, the upper case 120 is brought to a position where the insertion holes 230C and 230D and the screw holes 211A and 211B of the lower case 110 agree with each other. Then, the setscrew 130 is screwed into the screw holes 211A and 211B via the insertion holes 230C and 230D. Thereby, the upper case 120 is attached to the lower case 110. When the setscrew 130 is screwed in, both end sides in the right-left direction of the resilient deformable portion 230 are forced in the direction to be closer to the lower side plate 112 and shifts toward it. On the other hand, substantially the center in the right-left direction of the of the resilient deformable portion 230 is restrained from moving in the direction to be closer to the lower side plate 112 by the rib 231. Owing to this, the resilient deformable portion 230 is resiliently deformed so that the both end sides in the right-left direction shifts closer to the lower side plate 112, and the substantial center in the right-left direction is away therefrom by a distance substantially equal to the deformation amount H20 in the rib 231. And the rib 231 is pressed against the lower side plate 112 with the pressure force W20 expressed by the above-described formula 4 around the top area thereof owing to the restoring force of the resilient deformation of the resilient deformable portion 230. Same as the case in the first embodiment, the surface resistance value at the contact portion between the rib 231 and the lower side plate 112 is resulted in a predetermined value or less that reliably ensures the conduction between the upper case 120 and the lower case 110.

[Advantages of the Second Embodiment]

As described above, in the second embodiment, the upper side plate portion 122 is formed with the insertion holes 230C and 230D to be inserted with the setscrew 130 respectively and the resilient deformable portion 230 having the rib 231. Thereby, when the upper case 120 is attached to the lower case 110 using the setscrew 130, owing to the restoring force due to the resilient deformation of the resilient deformable portion 230, the rib 231 is brought into contact with the lower side plate 112 of the lower case 110 with the pressure force W20. Therefore, only by attaching the upper case 120 to the lower case 110 with the setscrew 130, the rib 231 of the upper case 120 can be brought into contact with the lower side plate 112 of the lower case 110 with the pressure force W20; and thus, the surface resistance value in the contact portion with the rib 231 in the lower side plate 112 can be reduced to a predetermined value or less. Accordingly, the conduction between the upper case 120 and the lower case 110 can be easily and reliably ensured. Also, since the rib 231 is brought into contact with the lower case 110 with the pressure force W20 using the restoring force due to the resilient deformation of the resilient deformable portion 230, the pressure force W20 can be maintained at a specific level without depending on the torque of the setscrew 130. Thus, the conduction between the upper case 120 and the lower case 110 can be ensured more reliably.

Further, the resilient deformable portion 230 is formed between the slits 221A and 221B formed in the upper side plate portion 122. Owing to this arrangement, such a structure that portion other than the resilient deformable portion 230 in the upper side plate portion 122 can be appropriately brought into contact with the lower side plate 112. Therefore, the conductivity between the upper case 120 and the lower case 110 can be further improved. Furthermore, compared with the structure without the slits 221A and 221B, the area to be deformed resiliently can be reduced to a minimum. Therefore, the resilient deformable portion 230 can be deformed resiliently with a smaller work; thus, the rib 231 can be brought into contact with the lower side plate 112, and the conduction between the upper case 120 and the lower case 110 can be easily ensured.

In addition to a conventional structure, since only the slits 221A and 221B and the rib 231 are formed on the upper side plate portion 122, the cost of the shield case 100 can be prevented from increasing and kept to a minimum.

The resilient deformable portion 230 and the rib 231 are arranged so that the pressure force W20 to press them against the lower side plate 112 can be calculated using the above-described formula 3 and formula 4. Owing to this, even when the rib 231 cannot be formed in the center between the insertion hole 230C and the insertion hole 230D depending on, for example, the configuration of the lower side plate 112, the rib 231 can be brought into contact with the lower side plate 112 with the preferred pressure force W20. Accordingly, for example, the configuration of the lower side plate 112 is not particularly limited, and accordingly the versatility of the shield case 100 can be increased.

Also, the rib 231 is formed so as to swell out from the inner surface 230B of the resilient deformable portion 230 in a substantially semi-circular shape in section. Further, the resilient deformable portion 230 is formed so as to be deformable resiliently in the direction substantially perpendicular to the inner surface 230B and structured so that the rib 231 is brought into contact with the lower side plate 112 with the restoring force of the resilient deformation of the resilient deformable portion 230. Furthermore, the conduction device comprising the resilient deformable portion 230, the rib 231 and the setscrew 130 is applied to the upper case 120 and the lower case 110 for receiving the electronic device U. Still further, the lower case 110 is provided with a grounding portion. And the rib 231 is formed on the resilient deformable portion 230 by means of press molding. Owing to this arrangement, the same advantages as that in the first embodiment can be obtained.

Third Embodiment

Next, a third embodiment of the present invention will be described below with reference to the drawings. FIG. 5A through FIG. 5C are schematic views respectively roughly showing the structure of an essential portion of a shield case in accordance with the third embodiment of the present invention. FIG. 5A is a front view thereof, FIG. 5B is a sectional view taken along the line IV-IV in FIG. 5A, and FIG. 5C is a sectional view taken along the line V-V in FIG. 5A.

[Structure of the Shield Case]

In FIG. 5A through FIG. 5C, reference numerals 122 and 112 denote the upper side plate portion of the upper case 120 and the lower side plate of the lower case 110 constituting shield case 100 as shown in FIG. 1. Here, the vertical direction in FIG. 5A substantially agrees with the vertical direction of the upper case 120.

In the upper side plate portion 122, same as the slits 221A and 221B in the second embodiment, slits 321A and 321B are formed. A portion having a substantially rectangular plate shape formed between the slits 321A and 321B is a resilient deformable portion 330 constituting the pressure member resiliently deformable in the direction toward/away from the lower side plate 112. In substantially the center of the resilient deformable portion 330 in the right-left direction thereof, an insertion hole 330C, which communicates an outer surface 330A and an inner surface 330B of the resilient deformable portion 330 with each other and the setscrew 130 is inserted therethrough, is bored. Also, in the both end sides of the inner surface 330B of the resilient deformable portion 330 in the right-left direction, ribs 331A and 331B, which constitute the pressure member formed by means of press molding so as to swell out from the inner surface 330B, are provided. These ribs 331A and 331B are formed in a substantially thin elongated rectangular shape viewed from front, of which longitudinal direction substantially agrees with the vertical direction, and the section substantially perpendicular to the longitudinal direction has a substantially semi-circular shape. The conduction device of the present invention comprises the resilient deformable portion 330, the ribs 331A, 331B and the setscrew 130.

The resilient deformable portion 330 and the ribs 331A, 331B are designed based on the following formula 5 through formula 7.

$$I30=((A30)\times(t30)^3)/12 \qquad (5)$$

I30: sectional secondary moment of the resilient deformable portion 330

A30: dimension of length in the vertical direction of the resilient deformable portion 330 t30: dimension of thickness of the resilient deformable portion 330

$$W30a=(3\times(E30)\times(I30)\times(H30)\times(3\times(L31)+(L32)))/((L31)^3\times(L32)) \qquad (6)$$

W30a: pressure force of the rib 331A in the direction to be closer to the lower side plate 112

E30: the longitudinal resilient coefficient of the material constituting the resilient deformable portion 330

H30: deformation amount of the ribs 331A and 331B

L31: dimension of length from the insertion hole 330C to the rib 331A

L32: dimension of length from the insertion hole 330C to the rib 331B

$$W30b=(3\times(E30)\times(I30)\times(H30)\times((L31)+3\times(L32)))/((L31)\times(L32)^3) \qquad (7)$$

W30b: pressure force of the rib 331B in the direction to be closer to the lower side plate 112

That is to say, the resilient deformable portion 330 is formed so that the dimension of thickness is t30; the dimension of length in the vertical direction; i.e., the dimension of length of shorter side is A30 and longitudinal resilient coefficient is E30. Also, the ribs 331A, 331B are formed so that the deformation amount thereof is H30, the dimension of length up to the insertion hole 330C of the resilient deformable portion 330 is L31, L32 respectively.

Here, the sum W30 of the pressure force W30a of the rib 331A and the pressure force W30b of the rib 331B can be expressed by the following formula 8, which is equivalent to the formula of W20 in the formula 4:

$$W30=(W30a)+(W30b)=(3\times(E30)\times(I30)\times(H30)\times(L31+L32)^3)/((L31)^3\times(L32)^3) \qquad (8).$$

On the other hand, integrally formed in the lower side plate 112 is a projection 310, which is protruded from the inner surface 112A toward the inside of the lower case 110 in a substantially short cylinder shape. The projection 310 is formed at a position where, when the upper case 120 is attached to the lower case 110, the projection 310 substantially corresponds to the insertion hole 330C of the upper case 120. And bored in the position at substantially the center in the diameter direction of the projection 310 corresponding to the insertion hole 330C in the upper case 120 is a screw hole 311, which communicates an inner surface 310A of the projection 310 and the outer surface 112B of the lower side plate 112 with each other and is screwed with the setscrew 130.

[Assembling of the Upper Case to the Lower Case]

Next, assembling of the upper case 120 to the lower case 110 will be described with reference to figures.

First of all, the upper case 120 is brought to a position where the insertion hole 330C and the screw hole 311 of the lower case 110 agree with each other. Then, the setscrew 130 is screwed into the screw hole 311 via the insertion hole 330C. Here, when the setscrew 130 is screwed in, the substantial center in the right-left direction of the resilient deformable portion 330 is forced in the direction to be closer to the lower side plate 112 and shifts toward it. On the other hand, the both end sides in the right-left direction of the resilient deformable portion 330 is restrained from moving in the direction to be closer to the lower side plate 112 by the ribs 331A and 331B. Owing to this, the resilient deformable portion 330 is resiliently deformed so that the substantial center in the right-left direction shifts closer to the lower side plate 112 and the both end sides in the right-left direction are away therefrom by a distance substantially equal to the deformation amount H30 in the ribs 331A and 331B. And the ribs 331A and 331B are pressed against the lower side plate 112 with the pressure forces W30a and W30b expressed by the above-described formula 6 and formula 7 around the vicinity of the tip thereof owing to the restoring force due to the resilient deformation of the resilient deformable portion 330. Same as the case in the first embodiment, the surface resistance value at the contact portion between the ribs 331A and 331B and the lower side plate 112 is resulted in a predetermined value or less that reliably ensures the conduction between the upper case 120 and the lower case 110.

[Advantages of the Third Embodiment]

As described above, in the third embodiment, the upper side plate portion 122 is formed with the insertion hole 330C to be inserted with the setscrew 130 and the resilient deformable portion 330 having the ribs 331A and 331B. Owing to this arrangement, when the upper case 120 is attached to the lower case 110 using the setscrew 130, the ribs 331A and 331B are brought into contact with the lower side plate 112 of the lower case 110 with the pressure forces W30a, W30b owing to the restoring force due to the resilient deformation of the resilient deformable portion 330. Therefore, only by attaching the upper case 120 to the lower case 110 with the setscrew 130, the ribs 331A and 331B of the upper case 120 can be brought into contact with the lower side plate 112 of the lower case 110 with the pressure forces W30a, W30b, and the surface resistance value in the contact portion with the ribs 331A and 331B in the lower side plate 112 can be reduced to a predetermined value or less. Thus, the conduction between the upper case 120 and the lower case 110 can be easily and reliably ensured. Also, since the ribs 331A and 331B are brought into contact with the lower case 110 with the pressure forces W30a, W30b using the restoring force due to the resilient deformation of the resilient deformable portion 330, the pressure forces W30a, W30b can be maintained to a specific level without depending on the torque of the setscrew 130. Thus, the conduction between the upper case 120 and the lower case 110 can be reliably ensured.

Further, between the rib 331A and the rib 331B, one insertion hole 330C to be inserted with the setscrew 130 is formed. Owing to this arrangement, compared to the structure in the second embodiment, the process to screw in the setscrew 130 can be reduced. Accordingly, the conduction between the upper case 120 and the lower case 110 can be ensured more easily.

Furthermore, in addition to a conventional structure, only by forming the slits 321A and 321B and the ribs 331A and 331B to the upper side plate portion 122, the cost of the shield case 100 can be prevented from increasing and can be kept to a minimum.

The resilient deformable portion 330 and the ribs 331A and 331B are arranged so that the pressure forces W30a, W30b to press them against the lower side plate 112 can be calculated using the above-described formula 6 and formula 7. Owing to this, by setting the dimension of length L31, L32 from the ribs 331A and 331B to the setscrew 130, the pressure forces W30a and W30b for bringing the ribs 331A and 331B into contact with the lower side plate 112 can be set to a value different from each other respectively. Accordingly, by providing a single resilient deformable portion 330, the lower side plate 112 can be pressed with different pressure forces W30a and W30b; and thus, the versatility thereof can be increased.

Also, the ribs 331A and 331B are formed so as to swell out from the inner surface 330B of the resilient deformable portion 330 in a substantially semi-circular shape in section. Further, the resilient deformable portion 330 is formed so as to be deformable resiliently in the direction substantially perpendicular to the inner surface 330B, and structured so that the ribs 331A and 331B are brought into contact with the lower side plate 112 with the restoring force of the resilient deformation of the resilient deformable portion 330. Furthermore, the conduction device comprising the resilient deformable portion 330, the ribs 331A and 331B and the setscrew 130 is applied to the upper case 120 and the lower case 110 for receiving the electronic device U. Still further, the lower case 110 is provided with a grounding portion. Still furthermore, the ribs 331A and 331B are formed on the resilient deformable portion 330 by means of press molding. Owing to this arrangement, the same advantages as that in the first embodiment can be obtained.

Fourth Embodiment

Next, a fourth embodiment of the present invention will be described below with reference to the drawings. FIG. 6A and FIG. 6B are views respectively roughly showing the structure of an essential portion of the shield case in accordance with the fourth embodiment of the present invention. FIG. 6A is a front view thereof, and FIG. 6B is a sectional view taken along the line VI-VI in FIG. 6A.

[Structure of the Shield Case]

In FIG. 6A and FIG. 6B, reference numerals 122 and 112 denote the upper side plate portion of the upper case 120 and the lower side plate of the lower case 110 constituting the shield case 100 as shown in FIG. 1. Here, the vertical direction in FIG. 6A substantially agrees with the vertical direction of the upper case 120.

In substantially the center in the vertical direction of the upper side plate portion 122, an insertion hole 430A, which communicates the outer surface 122A and the inner surface 122B with each other and is inserted with the setscrew 130, is bored. Also, on the inner surface 122B of the upper side plate portion 122, four ribs 431 constituting the pressure member, which are formed by means of press molding, are provided so as to enclose the insertion hole 430A and swell out from the inner surface 122B. These ribs 431 are formed in a substantially short cylindrical shape between concentric circles C11 and C12 having the insertion hole 430A as the substantial center thereof, and each of them are provided in the vertical direction and right-left direction respectively of the insertion hole 430A. In this embodiment, the area enclosed by the concentric circle C12 and the vicinity portion of this area in the upper side plate portion 122 are a resilient deformable portion 430 constituting the pressure member resiliently deformable in the direction toward/away from the lower side plate 112. The conduction device of the present invention comprises the resilient deformable portion 430, the rib 431 and the setscrew 130.

The resilient deformable portion 430 and the ribs 431 are designed based on the following formula 9.

$$W40a=((16\times\pi\times(\omega40)\times(E40)\times(t40)^3)/(4\times12\times((D41)/2)\times(1-v^2))) \quad (9)$$

W40a: pressure force of each rib 431 in the direction to be closer to the lower side plate 112

π: circle ratio

ω40: flexure amount in the vicinity of the insertion hole 430A when the upper case 120 is attached to the lower case 110 (0<(ω40)≦dimension of height H40 of the ribs 431)

E40: the longitudinal resilient coefficient of the material constituting the resilient deformable portion 430 t40: dimension of thickness of the resilient deformable portion 430

D41: diameter of the concentric circle C11 v: Poisson's ratio

That is to say, the resilient deformable portion 430 is arranged so that the flexure amount in the vicinity of the insertion hole 430A when the upper case 120 is attached to the lower case 110 is ω40, the dimension of thickness is t40, and the longitudinal resilient coefficient is E40. Also, each of the ribs 431 is formed between the concentric circles C11 and C12 of which dimension of height is H40, and the diameter is D41 and D42 respectively.

Here, the sum W40 of the pressure forces W40a of the four ribs 431 can be obtained by the following formula 10:

$$W40=W40a\times4=((16\times\pi\times(\omega40)\times(E40)\times(t40)^3)/(12\times((D41)/2)\times(1-v^2))) \quad (10)$$

On the other hand, integrally formed in the lower side plate 112 is a projection 410, which is protruded from the inner surface 112A toward the inside of the lower case 110 in a substantially short cylinder shape. The projection 410 is formed at a position where, when the upper case 120 is attached to the lower case 110, the projection 410 substantially corresponds to the insertion hole 430A of the upper case 120. And bored in the position at substantially the center in the diameter direction of the projection 410 corresponding to the insertion hole 430A in the upper case 120 is a screw hole 411, which communicates the inner surface 410A of the projection 410 and the outer surface 112B of the lower side plate 112 with each other and is screwed with the setscrew 130.

[Assembling of the Upper Case to the Lower Case]

Next, assembling of the upper case 120 to the lower case 110 will be described with reference to figures.

First of all, the upper case 120 is brought to a position where the insertion hole 430A and the screw hole 411 of the lower case 110 agree with each other. Then, the setscrew 130 is screwed into the screw hole 411 via the insertion hole 430A to attach the upper case 120 to the lower case 110. Here, when the setscrew 130 is screwed in, the vicinity of the substantial center of the resilient deformable portion 430 is forced in the direction to be closer to the lower side plate 112 and shifts toward it. On the other hand, the peripheral vicinity of the resilient deformable portion 430 is restrained from moving in the direction to be closer to the lower side plate 112 by the rib 431. Owing to this, in the resilient deformable portion 430, the vicinity of the substantial center warps in the direction to be closer to the lower side plate 112 with respect to the vicinity of the peripheral. And each of the ribs 431 is pressed against the lower side plate 112 with the pressure force W40a expressed by the above-described formula 9 owing to the restoring force due to the resilient deformation of the resilient deformable portion 430. Same as the case in the first embodiment, the surface resistance value in the contact portion between each of the ribs 431 and the lower side plate 112 is resulted in a predetermined value or less that reliably ensures the conduction between the upper case 120 and the lower case 110.

[Advantages of the Fourth Embodiment]

As described above, in the fourth embodiment, the upper side plate portion 122 is formed with the insertion hole 430A to be inserted with the setscrew 130 and the resilient deformable portion 430 having the ribs 431. Owing to this arrangement, when the upper case 120 is attached to the lower case 110 using the setscrew 130, owing to the restoring force of the warped resilient deformable portion 430, each of the ribs 431 is brought into contact with the lower side plate 112 of the lower case 110 with the pressure force W40a. Therefore, only by attaching the upper case 120 to the lower case 110 using the setscrew 130, the ribs 431 on the upper case 120 can be brought into contact with the lower side plate 112 of the lower case 110 with the pressure force W40a; and thus, the surface resistance value in the contact portion with the rib 431 in the lower side plate 112 can be reduced to a predetermined value or less. Accordingly, the conduction between the upper case 120 and the lower case 110 can be easily and reliably ensured. Further, since the rib 431 is brought into contact with the lower case 110 with the pressure force W40a using the restoring force of the warped resilient deformable portion 430, the pressure force W40a can be maintain to a specific level without depending on the torque of the setscrew 130. Accordingly, the conduction between the upper case 120 and the lower case 110 can be reliably ensured.

Furthermore, in addition to a conventional structure, only by forming the ribs 431 to the upper side plate portion 122, the cost of the shield case 100 can be prevented from increasing and kept to a minimum.

Further, the resilient deformable portion 430 and rib 431 are arranged so that the pressure force W40a to press them against the lower side plate 112 can be calculated using the above-described formula 9. Also, the resilient, deformable portion 430 is formed so as to be deformable resiliently and structured so that the ribs 431 are brought into contact with the lower side plate 112 with the restoring force of the warped resilient deformable portion 430. Further, the conduction device comprising the resilient deformable portion 430, the rib 431 and the setscrew 130 is applied to the upper case 120 and the lower case 110 for receiving the electronic device U.

Furthermore, the lower case 110 is provided with a grounding portion. Still further, the ribs 431 are formed on the resilient deformable portion 430 by means of press molding. Owing to this arrangement, the same advantages as that in the first embodiment can be obtained.

Fifth Embodiment

Next, a fifth embodiment of the present invention will be described below with reference to the drawings. FIG. 7A and FIG. 7B are views respectively roughly showing the structure of an essential portion of a shield case. FIG. 7A is a front view thereof, and FIG. 7B is a sectional view taken along the line VII-VII in FIG. 7A

[Structure of the Shield Case]

In FIG. 7A and FIG. 7B, reference numerals 122 and 112 denote the upper side plate portion of the upper case 120 and the lower side plate of the lower case 110 constituting the shield case 100 as shown in FIG. 1. Here, the vertical direction in FIG. 7A substantially agrees with the vertical direction of the upper case 120.

In substantially the center in the height direction of the upper side plate portion 122, an insertion hole 530A, which communicates the outer surface 122A and the inner surface 122B of the upper side plate portion 122 with each other and is inserted with the setscrew 130, is bored. On the inner surface 122B of the upper side plate portion 122, a rib 531, which constitutes the pressure member formed by means of press molding, is provided so as to enclose the insertion hole 530A as well as swelling out from the inner surface 122B in a substantially rectangular shape in section; i.e., so as to swell out in a substantially cylinder shape. The rib 531 is formed between concentric circles C21 and C22 having the insertion hole 530A as the center thereof. In this embodiment, the area enclosed by the concentric circle C22 and the vicinity portion of this area in the upper side plate portion 122 are a resilient deformable portion 530 constituting the pressure member, which is resiliently deformable in the direction toward/away from the lower side plate 112. The conduction device of the present invention comprises the resilient deformable portion 530, the rib 531 and the setscrew 130.

The resilient deformable portion 530 and the rib 531 are designed based on the following formula 11.

$$W50=((16\times\pi\times(\omega50)\times(E50)\times(t50)^3)/(12\times((D51)/2)\times(1-v^2))) \quad (11)$$

W50: the pressure force of the rib 531 in the direction to be closer to the lower side plate 112

π: circle ratio

ω50: flexure amount in the vicinity of the insertion hole 530A when the upper case 120 is attached to the lower case 110 (0<(ω50)≦dimension of height H50 of the rib 531)

E50: the longitudinal resilient coefficient of the material constituting the resilient deformable portion 530 t50: dimension of thickness of the resilient deformable portion 530

D51: diameter of the concentric circle C21 v: Poisson's ratio

That is to say, the resilient deformable portion 530 is formed so that the flexure amount in the vicinity of the insertion hole 530A when the upper case 120 is attached to the lower case 110 is ω50, the dimension of thickness is t50, and the longitudinal resilient coefficient is E50. Also, the rib 531 is formed so that the dimension of height is H50 and disposed between the concentric circles C21 and C22 of which diameter are D51 and D52 respectively. The pressure force W50 of the rib 531 is expressed by the formula equivalent to W40 shown in formula 10 in the fourth embodiment.

On the other hand, integrally formed in the lower side plate 112 is a projection 510, which is protruded from the inner surface 112A toward the inside of the lower case 110 in a substantially short cylinder shape. The projection 510 is formed at a position where, when the upper case 120 is attached to the lower case 110, the projection 510 substantially corresponds to the insertion hole 530A of the upper case 120. And bored in the position at substantially the center in the diameter direction of the projection 510 corresponding to the insertion hole 530A in the upper case 120 is a screw hole 511, which communicates an inner surface 510A of the projection 510 and the outer surface 112B of the lower side plate 112 and is screwed with the setscrew 130.

[Assembling of the Upper Case to the Lower Case]

Next, assembling of the upper case 120 to the lower case 110 will be described with reference to figures.

First of all, the upper case 120 is brought to a position where the insertion hole 530A and the screw hole 511 of the lower case 110 agree with each other. Then, the setscrew 130 is screwed into the screw hole 511 via the insertion hole 530A to attach the upper case 120 to the lower case 110. Here, when the setscrew 130 is screwed in, the vicinity of the substantial center of the resilient deformable portion 530 is forced in the direction to be closer to the lower side plate 112 and shifts toward it. On the other hand, the peripheral vicinity of the resilient deformable portion 530 is restrained from moving in the direction to be closer to the lower side plate 112 by the rib 531. Owing to this, in the resilient deformable portion 530, the vicinity of the substantial center warps in the direction to be closer to the lower side plate 112 with respect to the vicinity of the peripheral. And the rib 531 is pressed against the lower side plate 112 with the pressure force W50 expressed by the above-described formula 11 owing to the restoring force of the warped resilient deformable portion 530. Same as the case in the first embodiment, the surface resistance value at the contact portion between the rib 531 and the lower side plate 112 is resulted in a predetermined value or less that reliably ensures the conduction between the upper case 120 and the lower case 110.

[Advantages of the Fifth Embodiment]

As described above, in the fifth embodiment, the upper side plate portion 122 is formed with the insertion hole 530A to be inserted with the setscrew 130 and the resilient deformable portion 530 having the rib 531. Owing to this arrangement, when the upper case 120 is attached to the lower case 110 using the setscrew 130, the rib 531 is brought into contact with the lower side plate 112 of the lower case 110 with the pressure force W50 due to the restoring force of the warped resilient deformable portion 530. Therefore, only by attaching the upper case 120 to the lower case 110 using the setscrew 130, the rib 531 of the upper case 120 can be brought into contact with the lower side plate 112 of the lower case 110 with the pressure force W50 and the surface resistance value in the contact portion with the rib 531 in the lower side plate 112 can be reduced to a predetermined value or less. Accordingly, the conduction between the upper case 120 and the lower case 110 can be easily and reliably ensured. Further, since the rib 531 is brought into contact with the lower case 110 using the restoring force of the warped resilient deformable portion 530 with the pressure force W50, the pressure force W50 can be maintained at a specific level without depending on the torque of the setscrew 130; thus, the conduction between the upper case 120 and the lower case 110 can be reliably ensured.

Further, in addition to a conventional structure, only by forming the rib 531 on the upper side plate portion 122, the cost of the shield case 100 can be prevented from increasing and kept to a minimum.

Still further, the rib 531 is formed so as to enclose the insertion hole 530A. Owing to this arrangement, for example, dust or the like can be prevented from coming in the area enclosed by the rib 531, and for example, the setscrew 130 can be screwed and unscrewed easily.

The resilient deformable portion 530 and rib 531 are arranged so that the pressure force W50 to press them against the lower side plate 112 can be calculated using the above-described formula 11. Further, the resilient deformable portion 530 is formed so as to be deformable resiliently, and structured so that the rib 531 is brought into contact with the lower side plate 112 by means of the restoring force of the warped resilient deformable portion 530. Furthermore, the conduction device comprising the resilient deformable portion 530, the rib 531 and the setscrew 130 is applied to the upper case 120 and the lower case 110 for receiving the electronic device U. Still further, the lower case 110 is provided with a grounding portion. Still further, the rib 531 is formed on the resilient deformable portion 530 by means of press molding. Owing to this arrangement, the same advantages as that in the first embodiment can be obtained.

[Modification of the Embodiment]

The present invention is not limited to the above-described embodiments. Within a range where the object of the present invention can be achieved, the following modifications also should be included in the present invention.

For example, a structure as shown in FIG. 8A and FIG. 8B may be adopted. Here, the vertical direction in FIG. 8A substantially agrees with the vertical direction of the upper case 120. In the structure shown in FIG. 8A and FIG. 8B, formed in parallel with each other in the right-left direction of the upper side plate portion 122 are slits 621A and 621B having a substantially thinly elongated rectangular shape respectively, of which longitudinal direction substantially agrees with the vertical direction. A part of a substantially rectangular plate shape formed between the slits 621A and 621B, of which longitudinal direction substantially agrees with the vertical direction, is a resilient deformable portion 630 constituting the pressure member capable of deforming resiliently in the direction toward/away from the lower side plate 112. The resilient deformable portion 630 is formed so as to swell out from the outer surface 122A of the upper side plate portion 122 toward the outside. Also, the resilient deformable portion 630 is formed so that the dimension of length in the right-left direction, i.e., dimension of length of the shorter side is A60. The resilient deformable portion 630 has a parallel portion 631 of a substantially rectangular plate shape disposed in substantially the center in the vertical direction so that an outer surface 631A is substantially parallel to the outer surface 122A of the upper side plate portion 122. In the substantially central area of the parallel portion 631, an insertion hole 631C, which communicates the outer surface 631A and an inner surface 631B with each other and is inserted with the setscrew 130, is bored. Also, the resilient deformable portion 630 has a bridge portion 632, which is formed at the both end sides in the vertical direction in a state of being inclined with respect to the outer surface 122A of the upper side plate portion 122, and links the upper side plate portion 122 with the parallel portion 631. The conduction device of the present invention comprises the resilient deformable portion 630 and the setscrew 130. In the following description, the connecting portions between the parallel portion 631 and the bridge portion 632 will be appropriately referred to as a bent portion K11; and the connecting portions between the bridge portion 632 and the upper side plate portion 122 will be appropriately referred to as a bent portion K12. On the other hand, integrally formed in the lower side plate 112 is a projection 610, which is protruded in a substantially short cylindrical shape from the inner surface 112A toward the inside of the lower case 110. And bored in the substantially central area in the diameter direction of the projection 610 and at the position corresponding to the insertion hole 631C of the upper case 120 is a screw hole 611.

Owing to the structure as described above, when the setscrew 130 is screwed in the screw hole 611 of the lower case 110 via the insertion hole 631C of the upper case 120, the parallel portion 631 and the vicinity of the bent portion K11 of the bridge portion 632 are forced and shifted toward the direction to be closer to the lower side plate 112. On the other hand, being already in contact with the lower side plate 112, the vicinity of the bent portion K12 of the bridge portion 632 is prevented from moving toward the direction to be closer to the lower side plate 112, and is brought into contact with the lower side plate 112 with a pressure force W60. The surface resistance value in the contact portion between the bent portion K12 and the lower side plate 112 is, same as the above-described embodiments, reduced to a predetermined value or less that reliably ensures the conduction between the upper case 120 and the lower case 110. The pressure force W60 can be appropriately altered by changing the dimension of length N61 between the bent portions K12 and the dimension of length N62 between the bent portions K11. Owing to this, with a simple structure in which the upper side plate portion 122 is provided with the resilient deformable portion 630, which has the insertion hole 631C to be inserted with the setscrew 130 and swells out from the outer surface 122A outward, the bent portion K12 can be brought into contact with the lower side plate 112 with the pressure force W60. Thus, the surface resistance value in the contact portion with the bent portion K12 in the lower side plate 112 can be reduced to a predetermined value or less. Accordingly, the conduction between the upper case 120 and the lower case 110 can be easily and reliably ensured.

Also, for example, as shown in FIG. 9A and FIG. 9B, in the case where the dimension of thickness t70 of the upper side plate portion 122 and a deformation amount H70 of a rib 731 are relatively small and the deformable amount of the upper side plate portion 122 is also small, such a structure, in which the slits 221A and 221B are not formed in the structure of the second embodiment, may be adopted. In the above structure also, when the upper case 120 is attached to the lower case 110 using the setscrew 130, owing to the restoring force due to the resilient deformation of a resilient deformable portion 730 constituting the conduction device and pressure member sandwiched by insertion holes 730A and 730B in the upper side plate portion 122, the rib 731 constituting the conduction device and pressure member can be brought into contact with the lower side plate 112 of the lower case 110 with a pressure force W70. Owing to this, the conduction between the upper case 120 and the lower case 110 can be easily and reliably ensured without forming the slits 221A and 221B. Accordingly, compared to the structure in the second embodiment, the manufacturing cost of the upper case 120 can be reduced.

Further, in the second embodiment and in the structure shown in FIG. 9A and FIG. 9B, an example of the structure, in which the ribs 231 and 731 are formed in the area between the two mounting positions of the setscrews 130 in the resilient deformable portion 230, 730, is given. The structure is not limited to the above. For example, the following structure may be adapted. That is, such a structure that other setscrews 130 can be mounted in, for example, portions lower than the two setscrews 130 in the resilient deformable portions 230, 730, and the rib 231,731 are formed in the substantially central area enclosed by mounting portions of these four setscrews 130, may be adopted. In the above structure also, the same advantages as that in the above described second embodiment and in the structure shown in FIG. 9A and FIG. 9B can be obtained.

Furthermore, in the fourth embodiment, an example of a structure, in which the rib 431 is formed between the concentric circles C11 and C12, has been described. However, for example, such a structure as shown in FIG. 10A and FIG. 10B may be adopted. In a structure shown in FIG. 10A and FIG. 10B, ribs 831, 832, 833 and 834 constituting the conduction device and pressure member are disposed one each in the vertical direction and right-left direction with respect to an insertion hole 830A to be inserted with the setscrew 130. These ribs 831, 832, 833 and 834 are formed in a substantially short column-like shape, so that, for example, the diameter thereof has a value different from each other as D81, D82, D83 and D84 respectively; and the dimension of height has, for example, a value different from each other as H81, H82, H83 and H84 respectively. Further, the ribs 831, 832, 833 and 834 are formed so that, for example, the dimension of length from the substantial center of the insertion hole 830A is a value different from each other as L81, L82, L83 and L84. In such a structure also, when the upper case 120 is attached to the lower case 110 using the setscrew 130, the ribs 831, 832, 833 and 834 can be brought into contact with the lower side plate 112 of the lower case 110 with a pressure force W80 owing to the restoring force of a warped resilient deformable portion 830 constituting the conduction device and pressure member enclosed by the ribs 831, 832, 833 and 834 in the upper side plate portion 122.

Figure 11A:
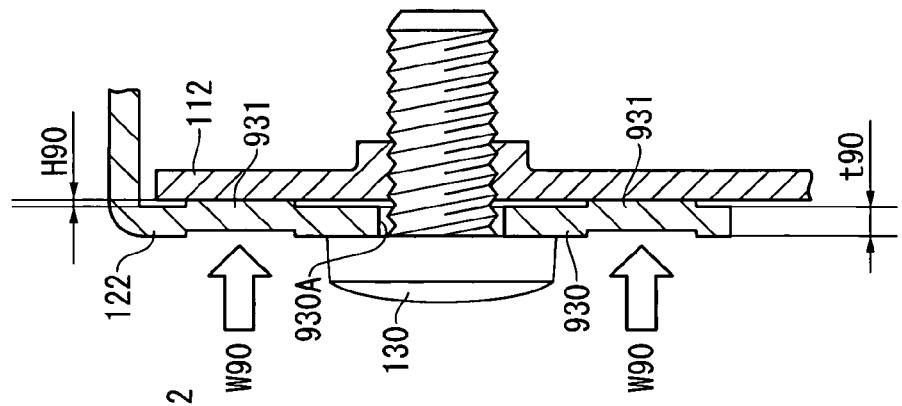
FIG. 11A and FIG. 11B are views respectively roughly showing the structure of an essential portion of a shield case in accordance with further another embodiment of the present invention.
Figure 11B:
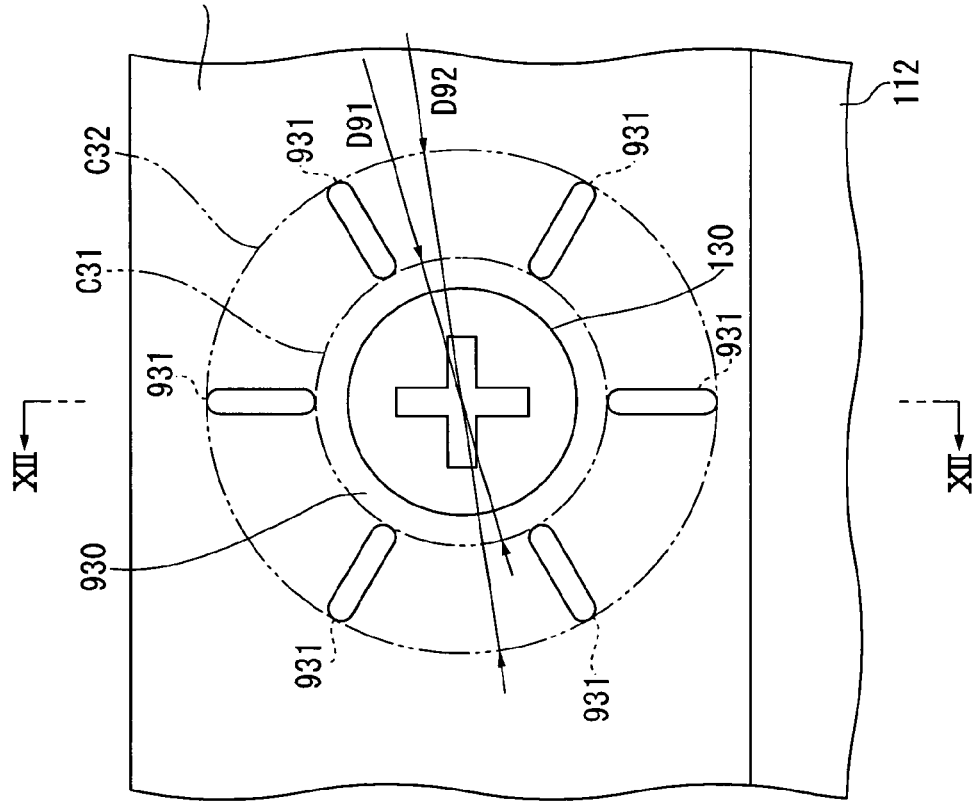

Still further, for example, such a structure as shown in FIG. 11A and FIG. 11B may be adopted. In a structure shown in FIG. 11A and FIG. 11B, six ribs 931 constituting the conduction device and pressure member are formed in a substantially thin elongated rectangular plate-like shape with the dimension of thickness of H90, and disposed between concentric circles C31 and C32 of diameters D91 and D92 respectively substantially around an insertion hole 930A with substantially the same distance in the direction of the periphery of the concentric circle C31. In such a structure also, when the upper case 120 is attached to the lower case 110 using the setscrew 130, the ribs 931 can be brought into contact with the lower side plate 112 of the lower case 110 with a pressure force W90 owing to the restoring force of a warped resilient deformable portion 930 constituting the conduction device and pressure member enclosed by the ribs 931 in the upper side plate portion 122.

Still furthermore, for example, such a structure as shown in FIG. 12A and FIG. 12B may be adopted. In a structure shown in FIG. 12A and FIG. 12B, four ribs 1031 constituting the conduction device and pressure member are formed in a substantially rectangular plate-like shape with the dimension of thickness of H100 between concentric circles C41 and C42 with diameters D101, D102 substantially around an insertion hole 1030A and one each in the vertical direction and the right-left direction with respect to the insertion hole 1030A. In such a structure also, when the upper case 120 is attached to the lower case 110 using the setscrew 130, the ribs 1031 can be brought into contact with the lower side plate 112 of the lower case 110 with a pressure force W100 owing to the restoring force of a warped resilient deformable portion 1030 constituting the conduction device and pressure member enclosed by the ribs 1031 in the upper side plate portion 122.

In the first embodiment, a structure, in which the resilient deformable portion 124 is formed in a substantially rectangular plate shape, has been described. However, the structure is not limited to the above. For example, a substantially triangle plate-like shape or a substantially trapezoid plate-like shape, in which the dimension of length in the right-left direction of the lower end side is shorter than the dimension of length in the right-left direction of the upper end side, may be adopted. By adopting such a structure, since the maximum bending stress in the vertical direction can be fixed to a specific level, the spring performance of the resilient deformable portion 124 can be increased.

In the embodiments, examples of the structure in which the setscrew 130 is used as the fixing member have been described, but the structure is not limited thereto. An appropriate structure, in which a part of the upper side plate portion 122 is bent to fix to the lower side plate 112, or, a catch formed on the upper side plate portion 122 is engaged with a hook formed in the lower side plate 112 to fix it, may be adopted. For example, by applying the above-described fixing member to one of the two setscrews 130 used in the structure of the second embodiment, the number of the setscrews 130 can be reduced; and thus, the work to screw the setscrew 130 can be reduced.

Further, for example, in the first embodiment, an example of a structure, in which the resilient deformable portion 124 and the rib 125 are formed in the lower side plate 112, has been described. For example, the resilient deformable portion 124 and the rib 125 may be formed in the upper side plate portion 122; or, one of them may be formed in the lower side plate 112, and the other of them may be formed in the upper side plate portion 122.

Furthermore, in the first embodiment, an example of a structure, in which the rib 125 is formed on the resilient deformable portion 124, has been described. Without forming the rib 125, but an appropriate structure, in which, for example, the lower end side of the resilient deformable portion 124 is bent to the direction of the lower side plate 112, and the bent portion is brought into contact with the lower side plate 112, may be adopted.

The conduction device of the present invention may be applied to such a structure in which a structure for conducting an electronic device is formed in a first case and a structure to be grounded is formed in a second case, and the both are connected and fixed so that the resistance value between the first case and second case is a predetermined value or less. By adopting such a structure, only by attaching the first case to the second case, the grounding of the electronic device can be ensured; and thus, the grounding of an electronic device can be easily ensured.

Further, the conduction device according to the present invention can be applied to any structure for ensuring the conduction between a first member and a second member.

Furthermore, the fixing member and the pressure member of the conduction device are not limited to the above-described structures. An appropriate structure, which integrally connects and fixes the first member and second member with a pressure force so that the resistance value therebetween is a predetermined value or less, may be adopted.

And an actual structure and steps of the present invention may be changed to another appropriate structure and the like within a range where the object of the present invention can be achieved.

[Advantages of the Embodiments]

As described above, in the embodiments, the upper case 120 is connected and fixed to the lower case 110 so that the surface resistance value in the contact portion with the rib 125 on the upper case 120 in the lower side plate 112 of the lower case 110 is R10 or less. Owing to this, the conduction between the upper case 120 and the lower case 110 can be easily and reliably ensured.

Also, in the upper side plate portion 122 of the upper case 120 of the shield case 100, the insertion hole 122C to be inserted with the setscrew 130 and the resilient deformable portion 124 having the rib 125 are formed. Owing to this, when the upper case 120 is attached to the lower case 110 using the setscrew 130, the rib 125 is brought into contact with the lower side plate 112 of the lower case 110 by the resilient deformable portion 124 with the pressure force W10. Accordingly, only by attaching the upper case 120 to the lower case 110 using the setscrew 130, the rib 125 of the upper case 120 can be brought into contact with the lower side plate 112 of the lower case 110 with the pressure force W10 and the surface resistance value in the contact portion with the rib 125 in the lower side plate 112 can be reduced to R10 or less. Thus, the conduction between the upper case 120 and the lower case 110 can be easily and reliably ensured.

The priority application Number JP 2004-029600 upon which this patent application is based is hereby incorporated by reference.

What is claimed is:

1. A conduction device for ensuring the conduction between a first member and a second member, comprising:
   a fixing member for integrally connecting and fixing the first member and the second member to each other; and
   a pressure member made of an electrically conductive material, the pressure member being integrally provided to at least either one of the first member and the second member and brought into contact with the other of the first member and the second member so that the resistance value between the first member and the second member is a predetermined value or less owing to the integral connection by the fixing member.

2. The conduction device according to claim 1, wherein
   the pressure member is provided to be deformable resiliently, deformed resiliently owing to the integral connection by the fixing member, and brought into contact with a pressure force larger than a predetermined value owing to the restoring force due to the resilient deformation.

3. The conduction device according to claim 2, wherein
   the pressure member includes a resilient deformable portion, which is formed protruding from an end edge of either one of the first member and the second member in the direction substantially perpendicular to the pressure direction in a substantially rectangular plate-like shape and to be deformable resiliently in the thickness direction, and a rib, which is formed to swell out in the pressure direction at a position a predetermined distance away from the end edge in the resilient deformable portion and the front end portion thereof is brought into contact;
   the rib is brought into contact with the other of the first member and the second member with a pressure force of a predetermined value or more owing to the restoring force due to the resilient deformation of the resilient deformable portion.

4. The conduction device according to claim 1, wherein the pressure member includes a rib formed to swell out in the direction of pressure, and the front end portion thereof is brought into contact with pressure.

5. The conduction device according to claim 3, wherein, assuming that the dimension of length of the side perpendicular to the direction protruding from the end edge of a substantially rectangular shape in the resilient deformable portion is A, the dimension of thickness of the resilient deformable portion is t, the predetermined distance is L, the amount of resilient deformation at a position formed with the rib in the resilient deformable portion is H, and the longitudinal resilient coefficient of the resilient deformable portion is E;

the rib is adapted so that the restoring force owing to the resilient deformation of the resilient deformable portion is resulted in a pressure force W obtained by the following formula (1):

$$W=(3 \times A \times t^3 \times H \times E)/(12 \times L^3) \quad (1).$$

6. The conduction device to according claim 2, wherein the pressure member includes a resilient deformable portion, which is formed in a substantially plate-like shape between a pair of slits formed in either one of the first member and the second member so as to be deformable resiliently in the thickness direction thereof, and a pair of ribs, which are formed so as to swell out in the thickness direction thereof in the vicinity of both ends of the resilient deformable portion corresponding to the both ends in the longitudinal direction of the slits, and the front end portion thereof is brought into contact, the fixing member causes the resilient deformable portion to deform resiliently in the central area of the resilient deformable portion corresponding to the central area in the longitudinal direction of the slits and connects and fixes the resilient deformable portion so that the ribs are brought into contact with a predetermined pressure force.

7. The conduction device according to claim 2, wherein the pressure member includes a resilient deformable portion, which is formed in a substantially plate-like shape between a pair of slits formed in the other of the first member and the second member so as to be deformable resiliently in the thickness direction thereof, and a pair of ribs, which are formed so as to swell out in the thickness direction thereof in the intermediate area of the resilient deformable portion corresponding to the intermediate portion in the longitudinal direction of the slits, and the front end portion thereof is brought into contact, a pair of fixing members is formed to connect and fix the resilient deformable portion while deforming resiliently in a state that the ribs are brought into contact with a predetermined pressure force at positions in the vicinity of the both end portions of the resilient deformable portion corresponding to the both end portions in the longitudinal direction of the slits.

8. The conduction device according to claim 6, wherein, assuming that the dimension of length of the side substantially perpendicular to one side of the substantially rectangular shape in the resilient deformable portion is A, the dimension of thickness of the resilient deformable portion is t, the dimensions of length from the position fixed by the fixing member to the ribs in the resilient deformable portion are L1 and L2, the amount of the resilient deformation at the position formed with the rib in the resilient deformable portion is H, and the longitudinal resilient coefficient of the resilient deformable portion is E;

the rib is adapted so that the restoring force owing to the resilient deformation of the resilient deformable portion is a pressure force W obtained by the following formula (2):

$$W=(3 \times (L1+L2)^3 \times E \times A \times t^3 \times H)/(12 \times L1^3 \times L2^3) \quad (2).$$

9. The conduction device according to claim 7, wherein, assuming that the dimension of length of the side substantially perpendicular to one side of the substantially rectangular shape in the resilient deformable portion is A, the dimension of thickness of the resilient deformable portion is t, the dimensions of length from the position fixed by the fixing member to the ribs in the resilient deformable portion are L1 and L2, the amount of the resilient deformation at the position formed with the rib in the resilient deformable portion is H, and the longitudinal resilient coefficient of the resilient deformable portion is E;

the rib is adapted so that the restoring force owing to the resilient deformation of the resilient deformable portion is a pressure force W obtained by the following formula (2):

$$W=(3 \times (L1+L2)^3 \times E \times A \times t^3 \times H)/(12 \times L1^3 \times L2^3) \quad (2).$$

10. The conduction device according to claim 4, wherein the fixing members connect and fix at a plurality of points being interposed by a predetermined distance, the rib is formed in an intermediate position between the fixing members.

11. The conduction device according to claim 4, wherein a plurality of the ribs is formed on a circumference around the position connected and fixed by the fixing member so as to swell out.

12. The conduction device according to claim 4, wherein the rib is formed in a substantially cylinder-like shape around the position connected and fixed by the fixing member so as to swell out.

13. The conduction device according to claim 11, wherein, assuming that the dimension of thickness of a portion enclosed by the rib of the pressure member is t, the radius of a portion enclosed by the rib of the pressure member is D, the flexure amount of the pressure member in the portion enclosed by the rib when connected and fixed by the fixing member is ω, the longitudinal resilient coefficient of the pressure member in a portion enclosed by the rib is E, the Poisson's ratio is ν, and the circle ratio is π;

the rib is adapted so that the restoring force of the warped pressure member in a portion enclosed by the rib is a pressure force W obtained by the following formula (3):

$$W=(16 \times \pi \times \omega \times E \times t^3)/(12 \times D \times (1-\nu^2)) \quad (3).$$

14. The conduction device according to claim 12, wherein, assuming that the dimension of thickness of a portion enclosed by the rib of the pressure member is t, the radius of a portion enclosed by the rib of the pressure member is D, the flexure amount of the pressure member in the portion enclosed by the rib when connected and fixed by the fixing member is $\omega$, the longitudinal resilient coefficient of the pressure member in a portion enclosed by the rib is E, the Poisson's ratio is $\nu$, and the circle ratio is $\pi$;

the rib is adapted so that the restoring force of the warped pressure member in a portion enclosed by the rib is a pressure force W obtained by the following formula (3):

$$W=(16\times\pi\times\omega\times E\times t^3)/(12\times D\times(1-\nu^2)) \tag{3}.$$

15. The conduction device according to claim 1, wherein the first member is a first case, which includes at least one opened face and has the conductivity, the second member is a second case, which closes at least the one opened face in the first case and has the conductivity, when attached to each other by the fixing member in a state that at least the one face is closed, the first member and the second member form a roughly partitioned electronic device receiving space for receiving an electronic device.

16. The conduction device according to claim 15, wherein either one of the first member and the second member is formed so that the electronic device received in the electronic device receiving space is conductible, and the other of the first member and the second member is formed so as to be grounded.

17. The conduction device according to claim 1, the first member and the second member are formed being coated with an insulating layer on the surface thereof.

18. The conduction device according to claim 1, wherein the pressure member is unitary with the at least either one of the first member and the second member.

19. The conduction device according to claim 1, wherein the fixing member comprises a screw, and wherein at least one of the first member and the second member includes a thread mating with the screw and the other one of the first member and the second member includes a screw hole.

20. The conduction device according to claim 1, wherein the first member comprises a first case having a first substantially thin box-like shape with the upper face opened, and the second member comprises a second cases having a second substantially thin box-like shape with the bottom face opened, and which closes the upper face of the lower case.

21. The conduction device according to claim 1, wherein the pressure member comprises a resilient deformable tongue that is unitary with the at least either one of the first member and the second member, and protrudes from an end edge of either one of the first member and the second member in the direction substantially perpendicular to the pressure direction, and the tongue comprises a rib, which is formed to swell out in the pressure direction at a position a predetermined distance away from the end edge, and wherein the first member comprises a first case having a first substantially thin box-like shape with the upper face opened, and the second member comprises a second cases having a second substantially thin box-like shape with the bottom face opened, and which closes the upper face of the lower case.

22. The conduction device according to claim 21, wherein the fixing member comprises a screw, and wherein at least one of the first member and the second member includes a thread mating with the screw and the other one of the first member and the second member includes a screw hole.

* * * * *